(12) United States Patent
Du et al.

(10) Patent No.: US 10,617,000 B2
(45) Date of Patent: Apr. 7, 2020

(54) PRINTED CIRCUIT BOARD (PCB) WITH THREE-DIMENSIONAL INTERCONNECTS TO OTHER PRINTED CIRCUIT BOARDS

(71) Applicant: Intel Corporation, Santa Clara, CA (US)

(72) Inventors: Daqiao Du, Lake Oswego, OR (US); Zhen Zhou, Chandler, AZ (US); Jun Liao, Hillsboro, OR (US); James A. McCall, Portland, OR (US); Xiang Li, Portland, OR (US); Kai Xiao, Portland, OR (US); Zhichao Zhang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/849,043

(22) Filed: Dec. 20, 2017

(65) Prior Publication Data

US 2019/0037689 A1 Jan. 31, 2019

(51) Int. Cl.
| | |
|---|---|
| H05K 1/02 | (2006.01) |
| H05K 1/05 | (2006.01) |
| H05K 1/11 | (2006.01) |
| H05K 1/14 | (2006.01) |
| H01R 12/72 | (2011.01) |
| H05K 3/36 | (2006.01) |

(52) U.S. Cl.
CPC ............ *H05K 1/0284* (2013.01); *H05K 1/05* (2013.01); *H05K 1/111* (2013.01); *H05K 1/115* (2013.01); *H05K 1/117* (2013.01); *H05K 1/141* (2013.01); *H01R 12/721* (2013.01); *H05K 1/0218* (2013.01); *H05K 1/0219* (2013.01); *H05K 1/142* (2013.01); *H05K 3/366* (2013.01); *H05K 2201/0723* (2013.01); *H05K 2201/0919* (2013.01); *H05K 2201/09063* (2013.01); *H05K 2201/09236* (2013.01); *H05K 2201/10189* (2013.01)

(58) Field of Classification Search
USPC ........................................................ 361/767
See application file for complete search history.

(56) References Cited

U.S. PATENT DOCUMENTS

| 5,244,395 A | 9/1993 | DeSantis et al. |
| 5,419,708 A | 5/1995 | Koss et al. |

(Continued)

OTHER PUBLICATIONS

European Search Report issued in European Patent Application No. 18207421.1, dated May 10, 2019, 10 pages.

*Primary Examiner* — Andargie M Aychillhum
(74) *Attorney, Agent, or Firm* — Grossman, Tucker, Perreault & Pfleger, PLLC

(57) ABSTRACT

A system for a three-dimensional ("3D") printed circuit board ("PCB") to printed circuit board interface is provided. A first PCB includes first landing pads disposed on one or more edges of the first PCB. The first landing pads electrically couple to conductive pins or second landing pads disposed on a second PCB. The second landing pads may be disposed in a slot in the second PCB. The interface between the first landing pads and the second landing pads may provide various advantages over traditional PCB to PCB interfaces, such as, improved signal integrity, improved power integrity, increased contact density, decreased clock jitter, etc.

26 Claims, 16 Drawing Sheets

(56) References Cited

U.S. PATENT DOCUMENTS

| | | | | |
|---|---|---|---|---|
| 6,545,895 B1* | 4/2003 | Li | ................. | G06F 13/409 |
| | | | | 365/51 |
| 2005/0225953 A1* | 10/2005 | Amir | ................. | H05K 3/3436 |
| | | | | 361/760 |
| 2008/0080152 A1* | 4/2008 | Duppong | ............... | H05K 3/301 |
| | | | | 361/760 |
| 2014/0022752 A1 | 1/2014 | Wille | | |

* cited by examiner

PRINTED CIRCUIT BOARD (PCB) WITH THREE-DIMENSIONAL INTERCONNECTS TO OTHER PRINTED CIRCUIT BOARDS

TECHNICAL FIELD

The present disclosure relates to systems and methods for three-dimensional printed circuit board to printed circuit board interconnects.

BACKGROUND

Existing random-access memory ("RAM") modules include memory dice mounted on a printed circuit board ("PCB"). The RAM module PCB typically includes landing pads on both a front and a rear surface, and are used to make electrical connection with a motherboard PCB. The electrical connection(s) with the motherboard PCB is typically made by orthogonally mounting the RAM module PCB onto the motherboard PCB between conductive pins, to allow the conductive pins to make contact with the landing pads on the front and rear surface of the of the RAM module PCB. The conductive pins of the motherboard are stamped pins and can be solder-mounted (in sockets) to landing pads on the motherboard PCB. The conductive pins may also be mounted to the motherboard PCB using vias.

These existing techniques negatively influence signal integrity and power integrity between the motherboard PCB and the RAM module PCB. As an example, both the conductive pins and the vias lengthen the electrical pathway between the two PCBs and therefore introduce discontinuities, crosstalk, and transmission line losses into the electrical pathway.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Although the following Detailed Description will proceed with reference being made to illustrative embodiments, many alternatives, modifications and variations thereof will be apparent to those skilled in the art.

DETAILED DESCRIPTION

The system for a three-dimensional ("3D") printed circuit board ("PCB") to printed circuit board interface is disclosed herein. A first PCB includes first landing pads disposed on one or more edges of the first PCB. The first landing pads electrically couple to conductive pins or second landing pads disposed on a second PCB. The second landing pads may be disposed in a slot in the second PCB. The first PCB may be a daughter card or a PCB for a communications cable. The second PCB may be a motherboard. The first and second PCB may couple together orthogonally (e.g., edge to surface) or co-planarly (e.g., edge to edge), according to various embodiments. The interface between the first landing pads and the second landing pads may provide various advantages over traditional PCB to PCB interfaces, such as, improved signal integrity, improved power integrity, increased contact density, decreased clock jitter, etc.

FIGS. 1A, 1B, 1C, 1D, 1E, and 1F illustrate various views of a system 100 that employs a three-dimensional ("3D") printed circuit board ("PCB") interface between two or more PCBs, according to one embodiment. The system 100 may correspond to a computing device including, but not limited to, a server, a workstation computer, a desktop computer, a laptop computer, a tablet computer (e.g., iPad®, GalaxyTab® and the like), an ultraportable computer, an ultramobile computer, a netbook computer and/or a subnotebook computer; a mobile telephone including, but not limited to a smart phone, (e.g., iPhone®, Android®-based phone, Blackberry®, Symbian®-based phone, Palm®-based phone, etc.) and/or a feature phone.

Figure 1A:
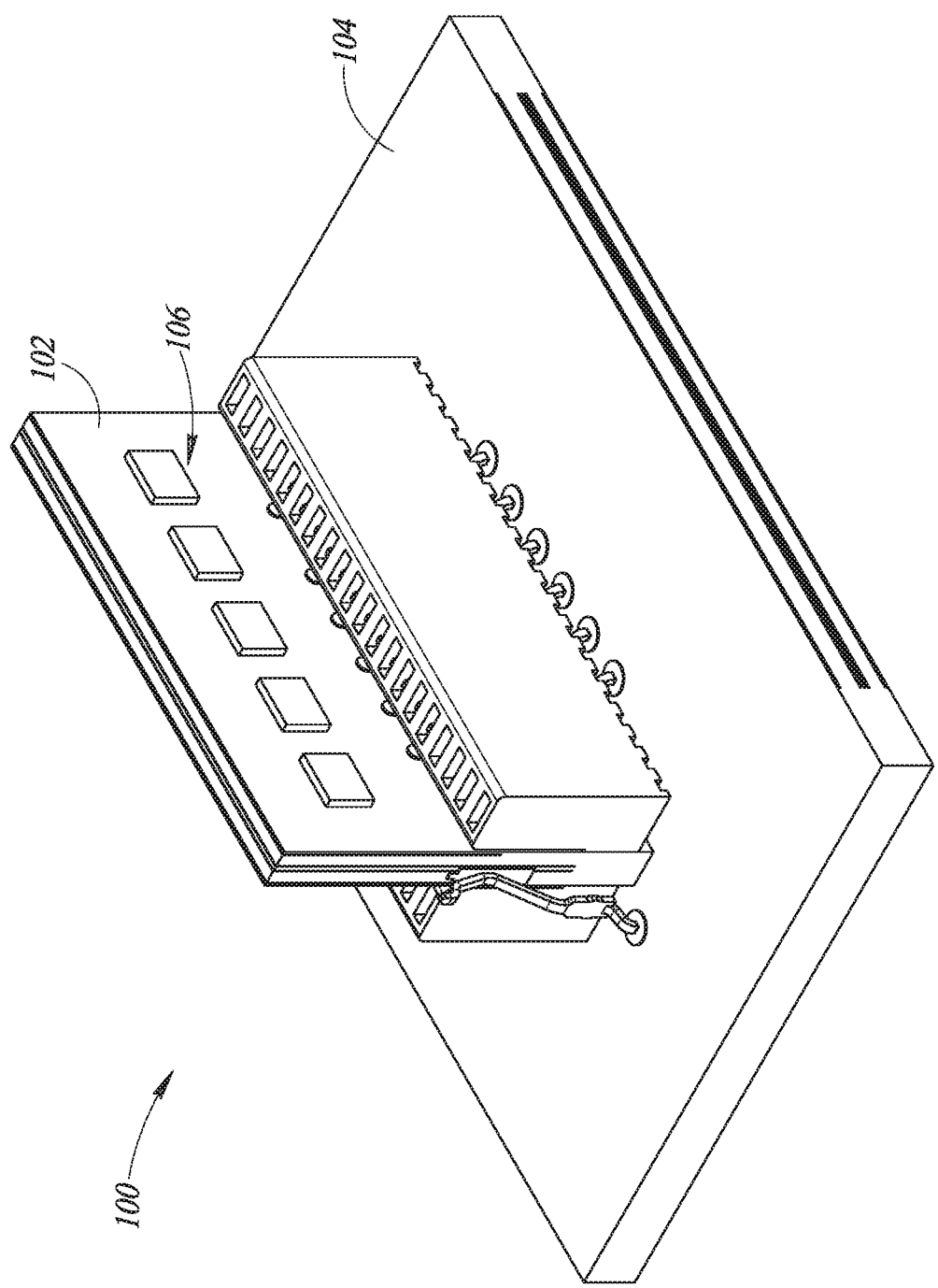
FIGS. 1A, 1B, 1C, 1D, 1E, and 1F are diagrams of views depicting an illustrative system that employs a three-dimensional ("3D") printed circuit board ("PCB") interface between two or more PCBs, according to one embodiment.

FIG. 1A depicts an illustrative perspective view of the system 100 for the 3D PCB interface, according to one embodiment. The system 100 includes a first PCB 102 coupled to a second PCB 104 with the 3D PCB interface, according to one embodiment. The first PCB 102 is a daughter card that carries a number of memory dice 106 and is configured as an interchangeable random-access memory ("RAM") memory module (e.g., a single or dual in-line memory module ("SIMM" or "DIMM"), according to one embodiment. The second PCB 104 is a motherboard configured to physically and electrically couple to the first PCB 102, to access and communicate with the number of memory dice 106, according to one embodiment. The 3D PCB interface employed by the system 100 uses one or more edges of the first PCB 102 to electrically couple the first PCB 102 to the second PCB 104, according to one embodiment. Use of the edges of the first PCB 102 to electrically couple the first PCB 102 to the second PCB 104 results in shorter electrical connections than traditional RAM memory module interconnects, according to one embodiment. The disclosed 3D PCB interface may improve signal integrity, power integrity, noise immunity, context density, and PCB routing flexibility, according to various embodiments.

The number of memory dice 106 may be RAM or may be a persistent storage device, such as an SSD, according to one embodiment. Each of the number of memory dice 106 may be a single memory die, according to one embodiment. The number of memory dice 106 may include non-volatile memory, e.g., a storage medium that does not require power to maintain the state of data stored by the storage medium, according to one embodiment. The number of memory dice 106 may include, but are not limited to, a NAND non-volatile memory (e.g., Single-Level Cell ("SLC"), Multi-Level Cell ("MLC"), Quad-Level Cell ("QLC"), Tri-Level Cell ("TLC"), or some other NAND), NOR memory, solid state memory (e.g., planar or three-dimensional (3D) NAND non-volatile memory or NOR non-volatile memory), memory devices that use chalcogenide phase change material (e.g., chalcogenide glass), byte addressable nonvolatile memory devices, ferroelectric memory, silicon-oxide-nitride-oxide-silicon ("SONOS") memory, polymer memory (e.g., ferroelectric polymer memory), byte addressable random accessible 3D XPoint™ memory, ferroelectric transistor random access memory ("Fe-TRAM"), magnetoresistive random access memory ("MRAM"), phase change memory ("PCM", "PRAM"), resistive memory, ferroelectric memory ("F-RAM", "FeRAM"), spin-transfer torque memory ("STT"), thermal assisted switching memory ("TAS"), millipede memory, floating junction gate memory ("FJG RAM"), magnetic tunnel junction ("MTJ") memory, electrochemical cells ("ECM") memory, binary oxide filament cell memory, interfacial switching memory, battery-backed RAM, ovonic memory, nanowire memory, electrically erasable programmable read-only memory ("EEPROM"), etc. In some embodiments, the byte addressable random accessible 3D XPoint™ memory may include a transistor-less stackable cross point architecture in which memory cells sit at the intersection of words lines and bitlines and are individually addressable and in which bit storage is based on a change in bulk resistance, in accordance with various embodiments.

Figure 1B:
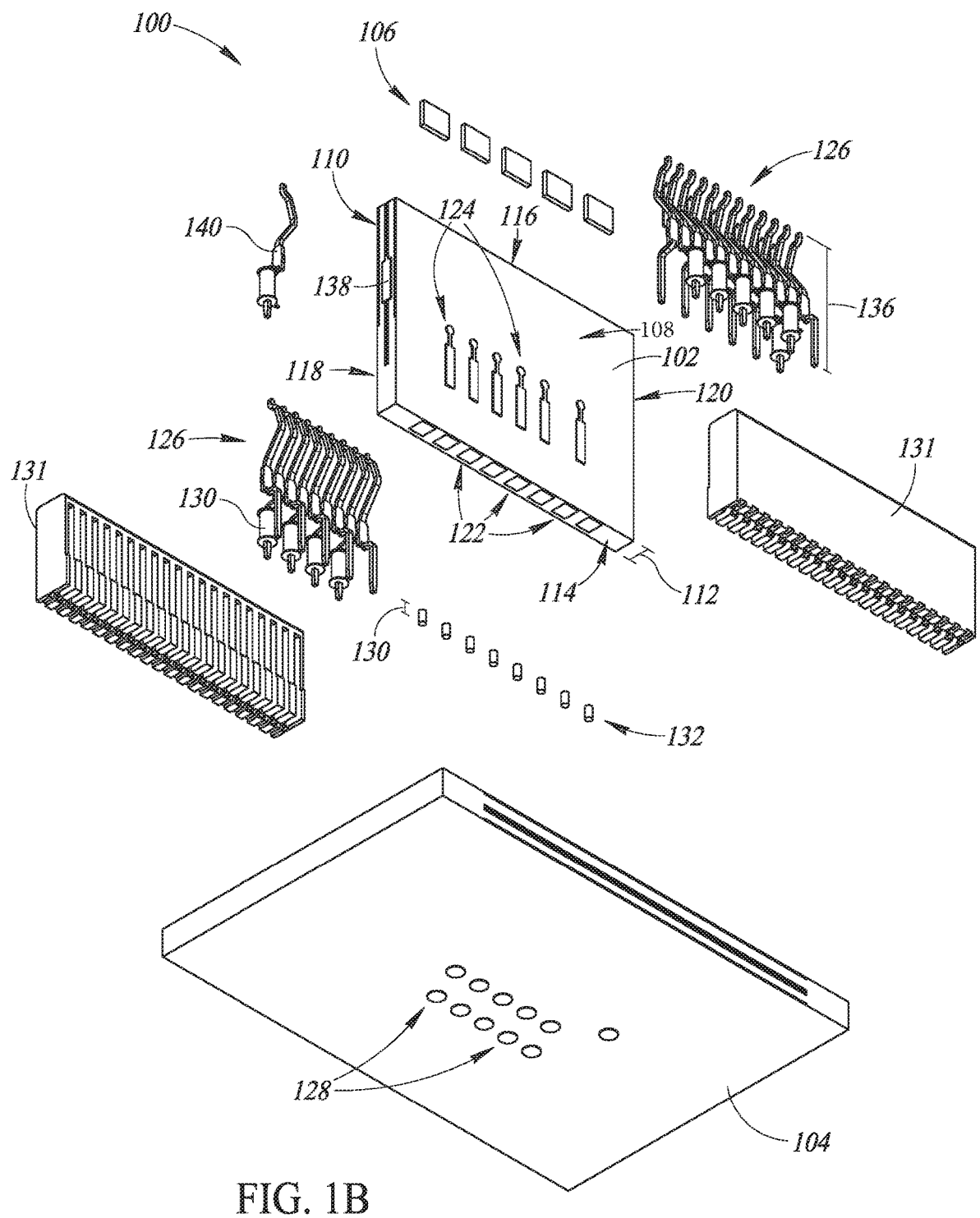

FIG. 1B depicts an illustrative bottom-referenced exploded view of the system 100. The first PCB 102 includes a first surface 108 and a second surface 110 that is transversely opposed to the first surface 108, according to one embodiment. The first surface 108 is separated from the second surface 110 by thickness 112 that forms edges around the periphery of the first surface 108, according to one embodiment. The edges include a bottom edge 114, a top edge 116, a left edge 118, and a right edge 120, according to one embodiment. The orientation of bottom, top, left, right is used for convenience of simplifying and describing the system 100, and is subject to change based on various different orientations that may be applied to the first PCB 102 and to the second PCB 104, according to one embodiment. The bottom edge 114 may be a first edge, the top edge 116 may be a second patch, the left edge 118 may be a third edge, and the right edge 120 may be a fourth edge, which together are a periphery of the first surface 108 and of the second surface 110, according to one embodiment.

The first PCB 102 includes a number of landing pads 122 disposed upon the bottom edge 114 to electrically couple the first PCB 102 to the second PCB 104, according to one embodiment. The number of landing pads 122 are electrically coupled to one or more conductive traces or conductive planes of the first PCB 102, according to one embodiment. As used herein, "a plurality of landing pads disposed on the edge and electrically coupled to one or more conductive traces or conductive planes of the printed circuit board" means the plurality of landing pads (e.g., the number of landing pads 122) are electrically coupled to conductive traces of the printed circuit board (e.g., the first PCB 102), are electrically coupled to conductive planes of the printed circuit board (e.g., the first PCB 102), or are electrically coupled to conductive traces and to conductive planes of the printed circuit board (e.g., the first PCB 102), according to one embodiment. In one embodiment, some or all of the number of landing pads 122 are electrically coupled to one or more traces that are on the first surface 108 and/or that are on the second surface 110. In one embodiment, some or all of the number of landing pads 122 are electrically coupled to one or more conductive planes that are disposed between the first surface 108 and the second surface 110. In one embodiment, some or all of the number of landing pads 122 are electrically coupled to one or more conductive traces that are disposed between the first surface 108 and the second surface 110. In one embodiment, the one or more conductive planes that are disposed between the first surface 108 and the second surface 110 include, but are not limited to, a voltage plane, a ground plane, and a reference plane. The one or more conductive traces or conductive planes are electrically coupled to the number of memory dice 106 and/or are electrically coupled to other components that are mounted to and/or carried by the first PCB 102, according to one embodiment. As a result, the number of landing pads 122 are electrically coupled (through the one or more conductive traces or conductive planes) to the number of memory dice 106 and/or other components that are mounted to and/or carried by the first PCB 102, according to one embodiment.

The number of landing pads 122 may replace or may supplement a number of landing pads 124 that are disposed on the first surface 108 and on the second surface 110 (not shown), according to one embodiment. The number of landing pads 124 represent a simplified example of landing pads up a count on traditional random-access memory ("RAM") dual in-line memory module ("DIMM"). The number of landing pads 124 may be disposed on the first surface 108 and/or on the second surface 110, according to one embodiment. The number of landing pads 124 are contacted by conductive pins 126, according to one embodiment. The conductive pins 126 are mechanically raised pins that couple to the first PCB 102 in two-dimensions ("2D"). That is the conductive pins 126 coupled to the first PCB 102 along the first surface 108 and the second surface 110. The conductive pins 126 are typically formed from stamped metal and are attached to the second PCB 104 through apertures 128 and with vias 130, according to one embodiment. The apertures 128 passed through the second PCB 104 and enables the conductive pins 126 to be electrically coupled to one or more conductive traces and/or conductive planes of the second PCB 104.

The configuration of the conductive pins 126 and the vias 130 are relatively standardized within the industry of RAM DIMM manufacturing. However, the length, width, thickness, and proximity to other pins, and other characteristics of the conductive pins 126 and the vias 130 increase the signal path from the second PCB 104, to the first PCB 102, and to the number of memory dice 106, and may introduce undesirable signal characteristics. Examples of the undesirable signal characteristics introduced by the traditional configuration of the conductive pins 126 include, but not limited to, reflection, bandwidth limitations, signal distortion, cross talk, and other transmission line losses. As described below, the use of the landing pads 122 provide superior signal integrity, signal noise, another signal characteristics, as compared to the conductive pins 126, according to one embodiment. Additionally, the characteristics and functionality of the number of landing pads 122 may approve the operational characteristics of the conductive pins 126, according to one embodiment.

The number of conductive pins 126 may be held in place, heat-sinked, or otherwise supported by the shrouds 131, according to one embodiment.

The bottom edge 114 may be electrically coupled to the second PCB 104 through a number of conductive pins 132 that are disposed between the landing pads on the second PCB and the landing pads 122, according to one embodiment. The conductive pins 132 are cylindrical pins and may be affixed to the landing pads of the second PCB 104 or may be affixed to the landing pads 122 of the first PCB 102, according to one embodiment. The conductive pins 132 have a length 134 that is significantly less than a length 136 of the conductive pins 126, according to one embodiment. The shorter length of the conductive pins 132 reduces electromagnetic reflections, reduces near-end crosstalk, reduces far-end crosstalk, reduces transmission line losses, and reduces the distance of signal path between the second PCB 104 and the first PCB 102, according to one embodiment.

The first PCB 102 may also include one or more additional landing pads disposed on one or more of the other edges of the first PCB 102, according to one embodiment. For example, the first PCB 102 may include a landing pad 138 that is disposed on the left edge 118, to provide additional electrical coupling between the first PCB 102 and a second PCB 104, according to one embodiment. The conductive pin 140 may electrically couple the second PCB 104 to the first PCB 102 through the landing pad 138, according to one embodiment.

Figure 1C:
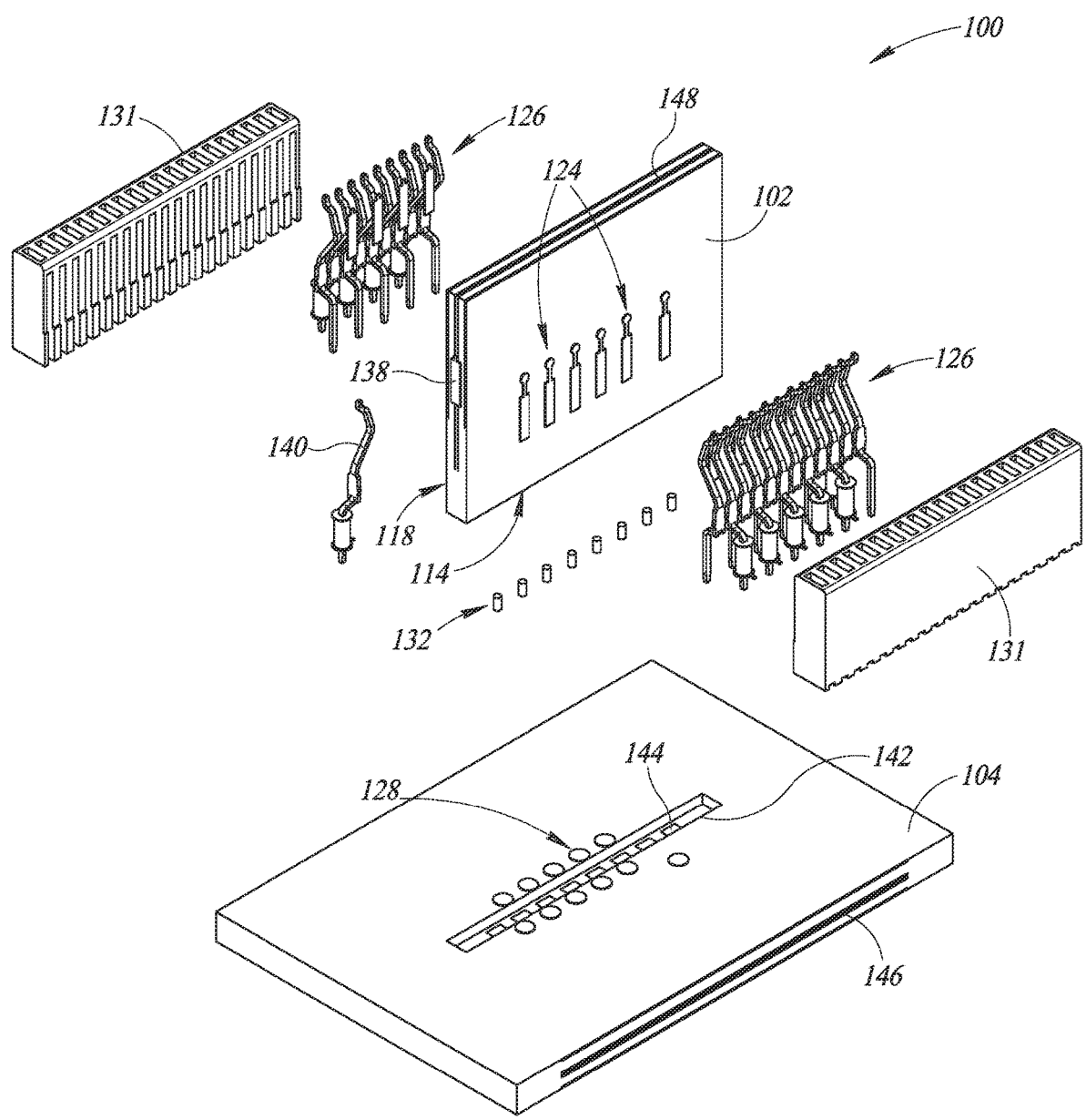

FIG. 1C depicts an illustrative top-referenced exploded view of the system 100, according to one embodiment. The top-referenced exploded view of the system 100 illustrates a slot 142 into which the first PCB 102 may be inserted, according to one embodiment. Inserting the first PCB 102 into the slot 142 of the second PCB 104 provides structural support to the physical interface between the first PCB 102 and the second PCB 104, according to one embodiment. The second PCB 104 includes a number of landing pads 144 that carry the conductive pins 132, according to one embodiment. The conductive pins 132 may be attached to the number of landing pads 144 or may be compressed by the conductive pins 132 to establish electric coupling between the first PCB 102 and the second PCB 104, along the bottom edge 114 and the slot 142, according to one embodiment.

The landing pads 122, the conductive pins 132, and the landing pads 144 enable a direct connection between one or more conductive planes 146 and one or more conductive planes 148, according to one embodiment. The one or more conductive planes 146 represent one or more of a voltage plane, a ground plane, and a reference plane, disposed within the thickness of the second PCB 104, according to one embodiment. The one or more conductive planes 148 represent one or more of a voltage plane, a ground plane, and a reference plane, disposed within the thickness of the first PCB 102, according to one embodiment.

Figure 1D:
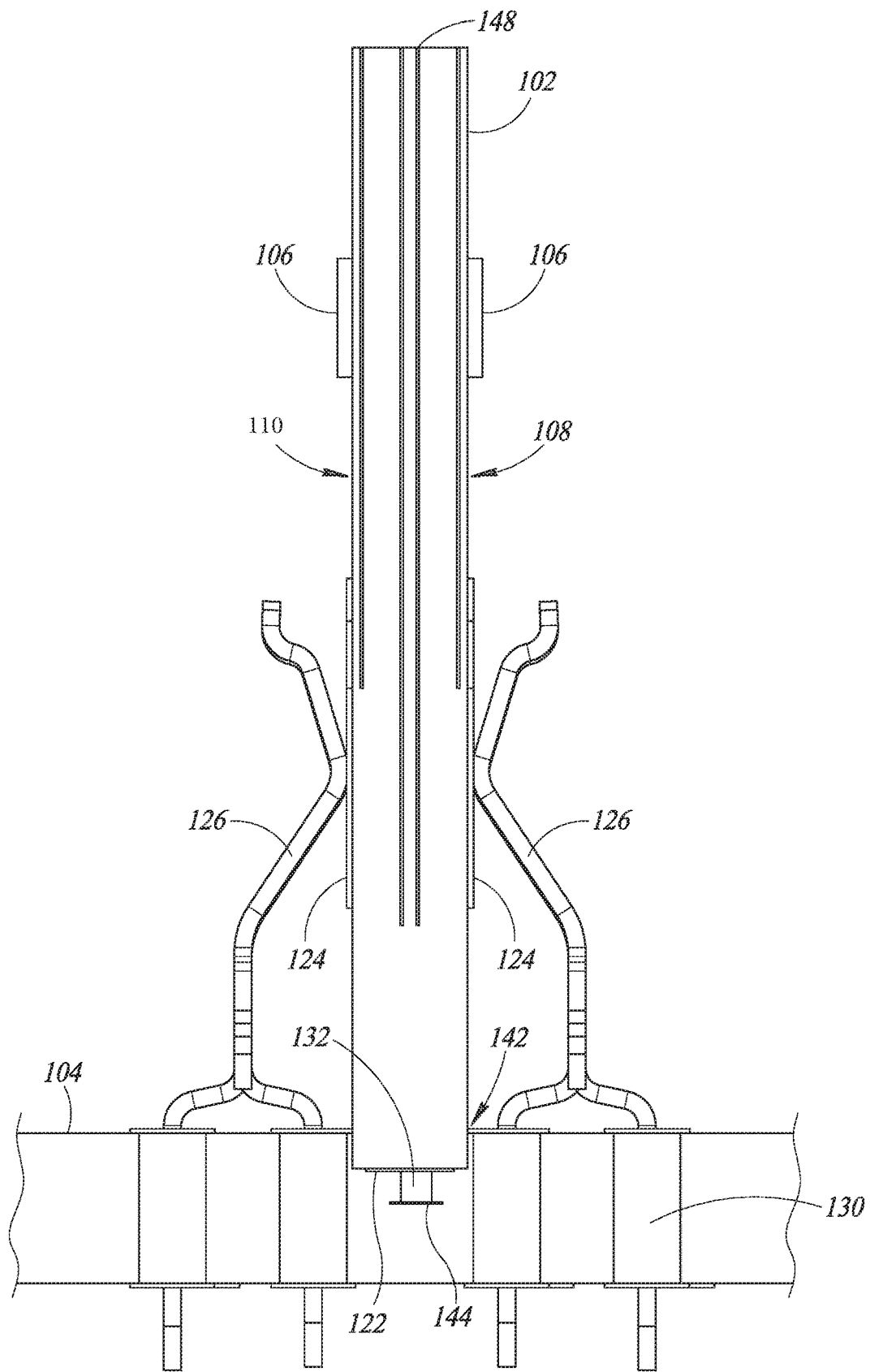

FIG. 1D depicts an illustrative partial side view of the system 100, according to one embodiment. The illustrative side view of the system 100 shows the first PCB 102 inserted into the slot 142 of the second PCB 104, according to one embodiment. Also illustrated are one of the landing pads 122 coupled to one of the conductive pins 132, which is coupled to one of the landing pads 144, to provide 3D electrical coupling between the first PCB 102 and the second PCB 104, according to one embodiment.

Figure 1E:
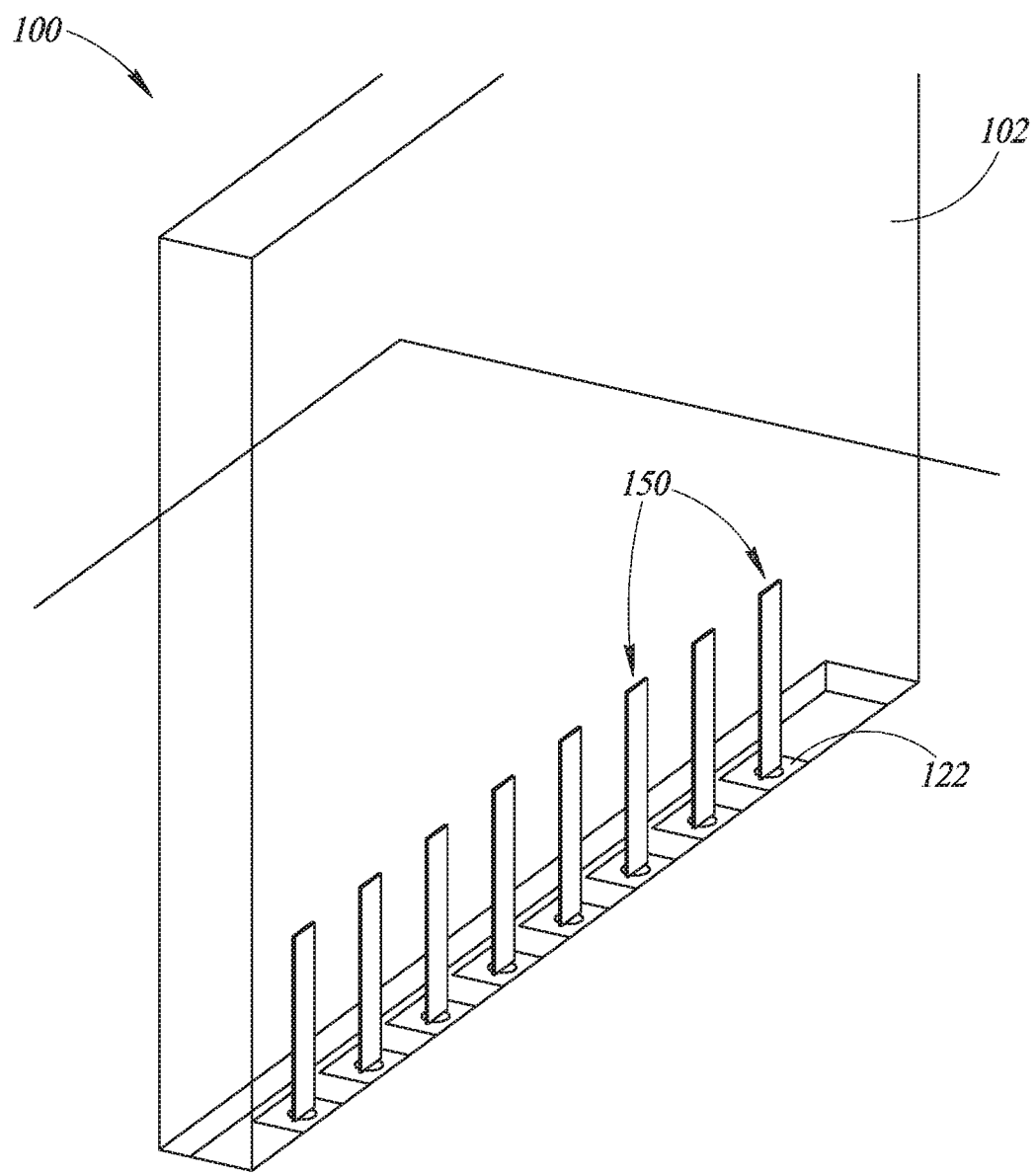
Figure 1E:
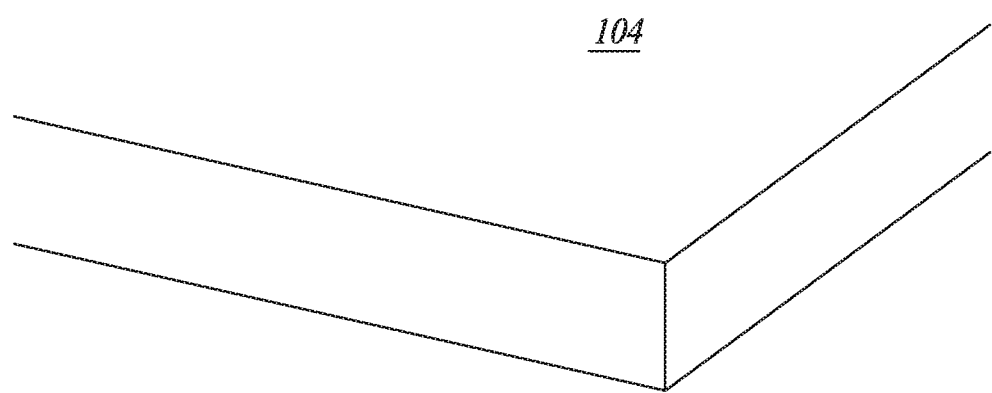

FIG. 1E depicts an illustrative partial perspective view of the first PCB 102 interconnected with the second PCB 104 through the landing pads 122, according to one embodiment. The landing pads 122 may be connected to one or more planes 148 (shown in FIG. 1C) through a number of conductive fingers 150, according to one embodiment. The number of conductive fingers may extend partially through the first PCB 102 between the first surface 108 (shown in FIG. 1D) and the second surface 110 (shown in FIG. 1D), according to one embodiment.

Figure 1F:
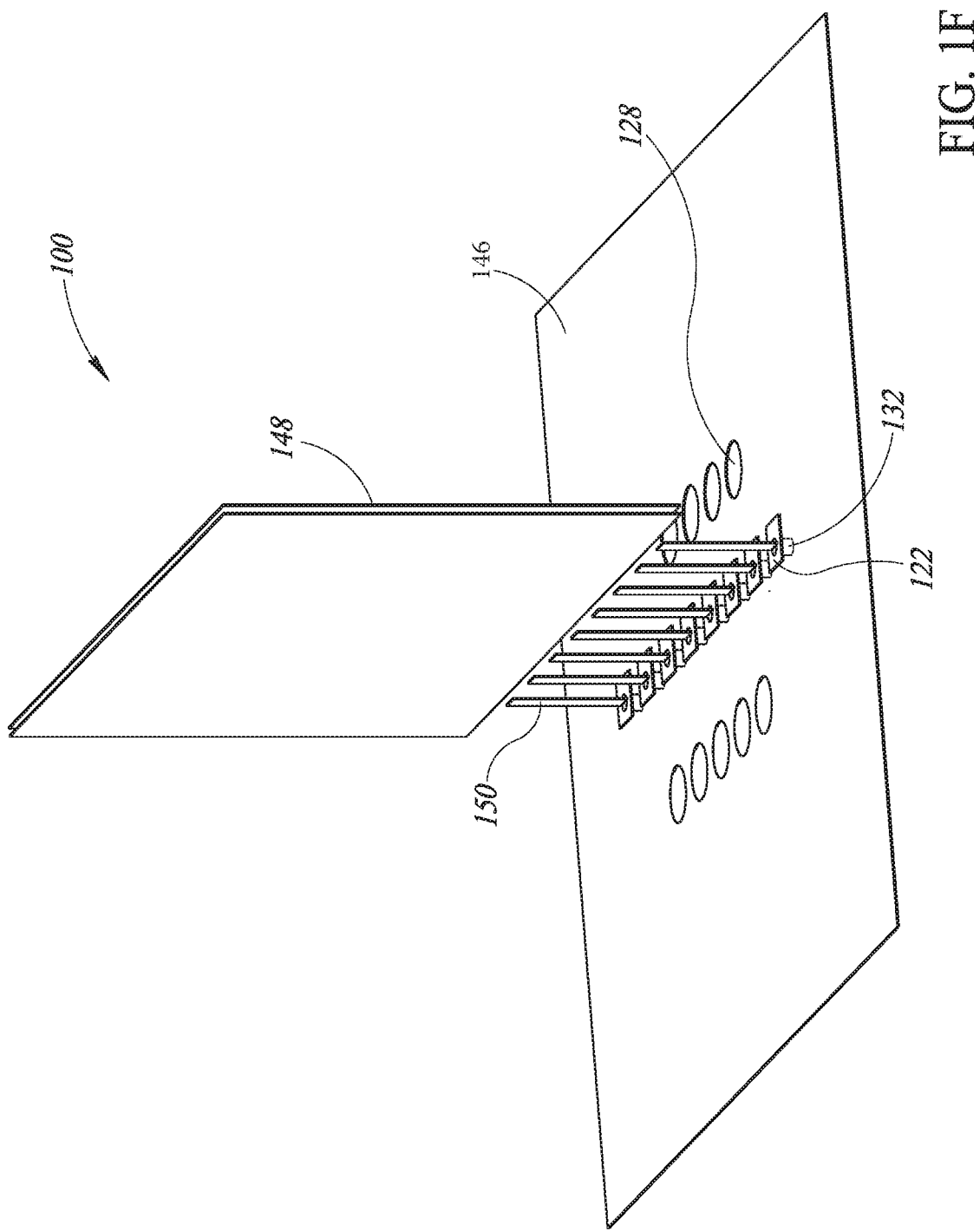

FIG. 1F depicts an illustrative exploded view of one or the one or more planes 146 stripped away from the remainder of the second PCB 104 and of the one or more planes 148 stripped away from other portions of the first PCB 102, according to one embodiment. The conductive pins 132 are connected or coupled to the one or more planes 146, the landing pads 122 are connected to the conductive fingers 150, which are used to electrically couple the one or more planes 148 to the landing pads 122, according to one embodiment. Although the one or more planes 146 and 148 are depicted as planes, in one embodiment, the one or more planes 146 and the one or more planes 148 are patterns of traces that are integrated within the first PCB 102 and/or the second PCB 104 to routes signals between components on the second PCB 104 to the components on first PCB 102, according to one embodiment. Unlike conventional PCB to PCB connections, the embodiment depicted in FIG. 1F provides a versatile and uniform reference plane between the first PCB 102 (e.g., a daughter card) and the second PCB 104 (e.g., a mother port), according to one embodiment.

The embodiments of FIGS. 1A-1F (as well as the embodiments described below) may provide numerous advantages to the technical fields of PCB layout, PCB routing, PCB to PCB interfacing, component to PCB interfacing, signal integrity, and noise control, among others. Specific advantages that may be achieved by embodiments of the disclosed 3D PCB interface include, but are not limited to, signal integrity, power integrity, noise immunity, context density, PCB routing flexibility, and potential for reduced PCB form factor, according to various embodiments.

Several characteristics of the disclosed embodiments improve signal integrity in the PCB to PCB interface. For example, the one or more conductive planes 148 may include a uniformed reference plane that may reduce or mitigate reflection and crosstalk induced by the lack of reference planes. In the current state of the art, reference planes are rarely if ever used, even in state of art card-edge connectors used in industry. Thus, the number of landing pads 122 enables the inclusion of and electrical coupling to one or more conductive planes 148, which may reduce reflection and crosstalk, according to one embodiment.

Furthermore, the number of landing pads 122 enable a more 'direct connection' between PCBs, packages to PCB, and PCBs to cables, according to various embodiments. Such direct connections reduce the use of vias and conductive pins similar to the conductive pins 126. Reducing the use of vias and reducing the use of conductive pins similar to the conductive pins 126 may result in shorter signal paths, which results in decreased crosstalk and decreased reflection.

The physical characteristics of the conductors that are signal paths for high-frequency signals may affect power integrity. Typically, a conductor's capacitance increases with width, the conductor's increases as width decreases, and the conductor's resistance increases and the width decreases. The conductive pins 126 are manufactured to be narrow so that multiple signals can be provided to and received from RAM DIMMs. The narrow dimensions of conductive pins 126 that are in use are generally quite inductive and highly resistive. When the conductive pins 126 are used to supply power, the inductance of the conductive pins 126 influences and exacerbates simultaneous switching noise, which results in a significant dynamic voltage ("IR") drop in the power delivery network ("PDN"). When the conductive pins 126 are used to supply power, the high resistance of the conductive pins 126 causes appreciable static IR drop. The detrimental effect of the inductance of the conductive pins 126 is made worse when contact is made with a landing pad (e.g., the landing pads 124). Because the landing pads 124 are wide, the landing pads 124 will have a higher capacitance than the conductive pins 126, and the combination of the capacitance of the landing pads 124 with the inductance of the conductive pins 126 may cause resonance in the PDN, which can require additional decoupling caps to ameliorate.

As compared to using pins such as the conductive pins 126 to provide power to the first PCB 102, the landing pads 124 and the one or more conductive planes 148 provide wider contacts that are less resistive, less inductive, and reduce/eliminate landing pad inductance, to generate improved PDN power integrity, over existing techniques, according to various embodiments.

In conventional PCB to PCB connections or in conventional cable to PCB connections, setting noise sensitive nets, such as a crystal input/output net and a voltage reference net for double data rate ("DDR") RAM, is difficult. Because the clock/crystal signals and voltage references are routed adjacent to rapidly changing control signals and data signals, clock jitter and voltage reference corruption are on-going problematic issues for the DDR RAM operation, and are limitations on increasing clock, control signal, and data signal speeds. The disclosed 3D PCB interface may enable the separation/segregation of noise-sensitive nets (e.g., clock and voltage reference) from the high-speed signals, which physically enhances the noise immunity of the connections, according to various embodiments.

Existing solutions for mitigating crosstalk involve including more pins between one PCB to another PCB, to lower the signal to ground ratio in a connector. More pins results in greater congestion in the region beneath the connectors. To alleviate the routing congestion, larger connectors are employed, which may impose additional routing difficulties to PCB layout. The disclosed 3D PCB interface utilizes contact pads (e.g., the landing pads 122) in relatively unused dimensions of PCB boards (e.g., the bottom edge 114), and hence adds more contacts without increasing routing congestion on PCB boards.

The disclosed 3D PCB interface enables signals to be routed to planes parallel to the top and bottom of the PCB and the planes that are orthogonal to the top and bottom of the PCB, thereby improving PCB routing flexibility, according to one embodiment.

The disclosed 3D PCB interface (e.g., the landing pads 122, the conductive fingers 150, and/or the one or more conductive planes 148) increases the overall number of contacts between the first PCB 102 and the second PCB 104, while maintaining the same form factor. As result, without increasing the size of existing PCBs, more electrical contacts per unit volume may be achieved. By employing the disclosed 3D PCB interface, maintaining the same number of contacts, as are used on existing PCB packages, would result in a dimensional reduction of the PCB packages because more contacts are available per unit volume, according to one embodiment.

Figure 2A:
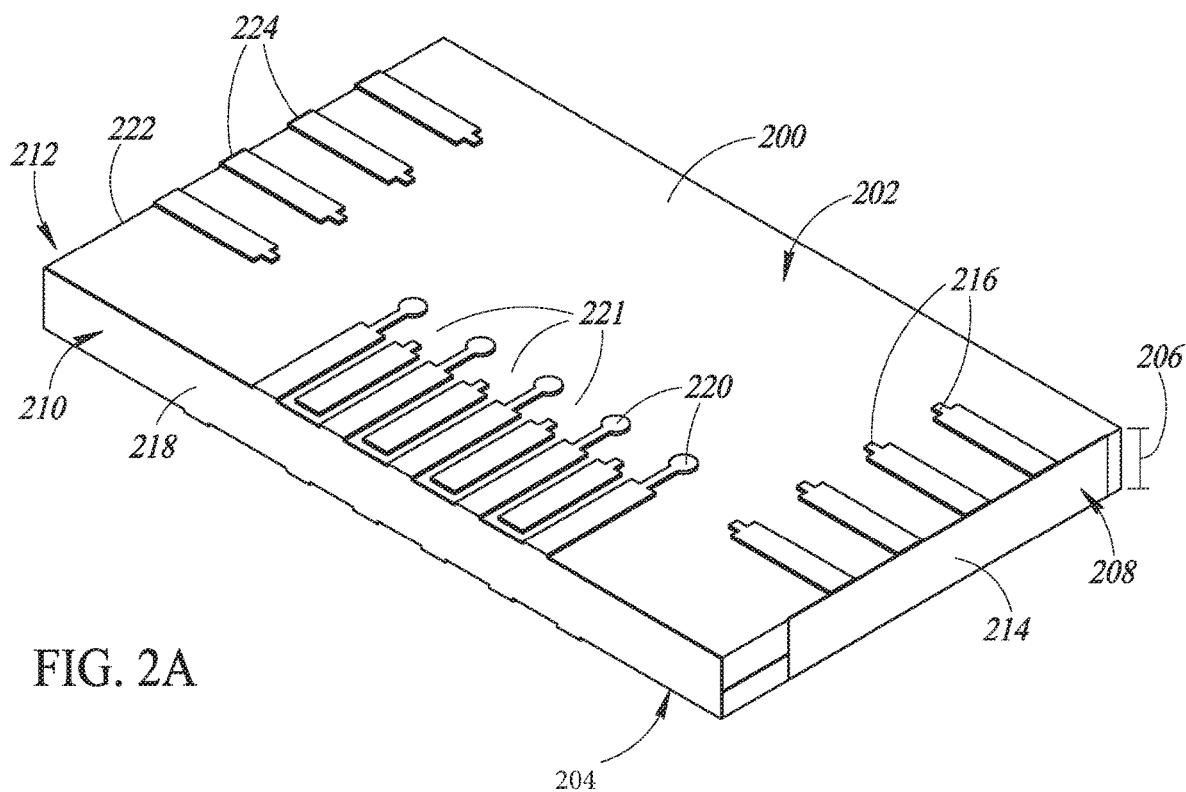
FIGS. 2A, 2B, and 2C are diagrams of views depicting an illustrative system that employs a 3D PCB interface between two or more PCBs, according to one embodiment.
Figure 2B:
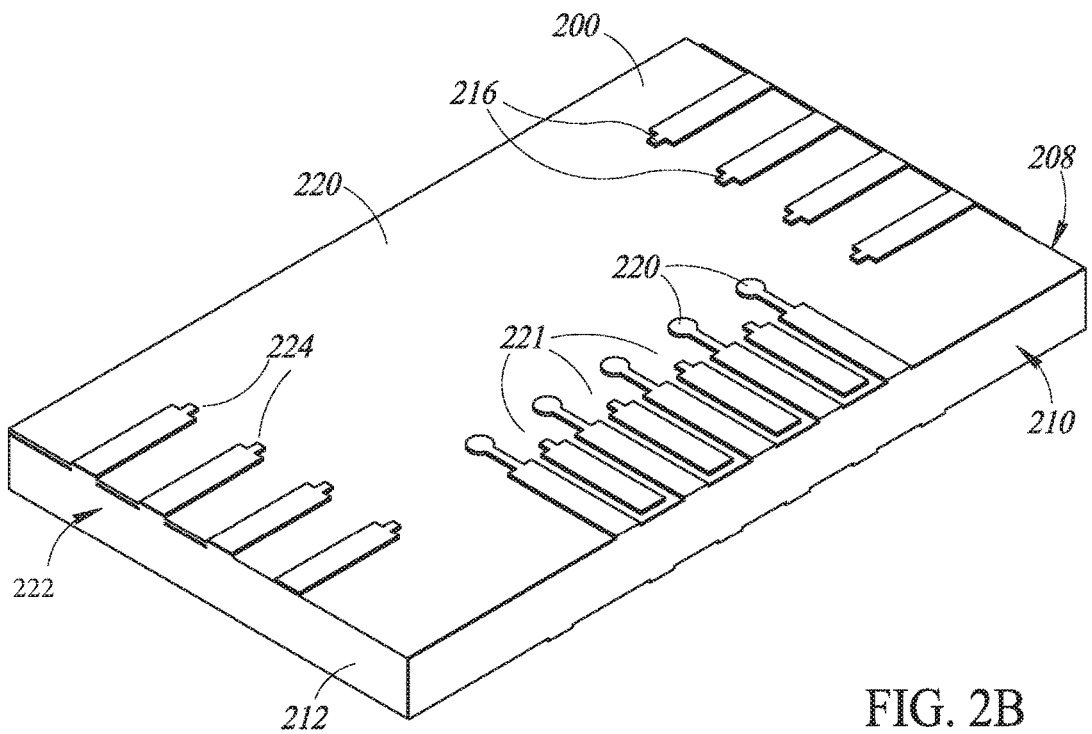
Figure 2C:
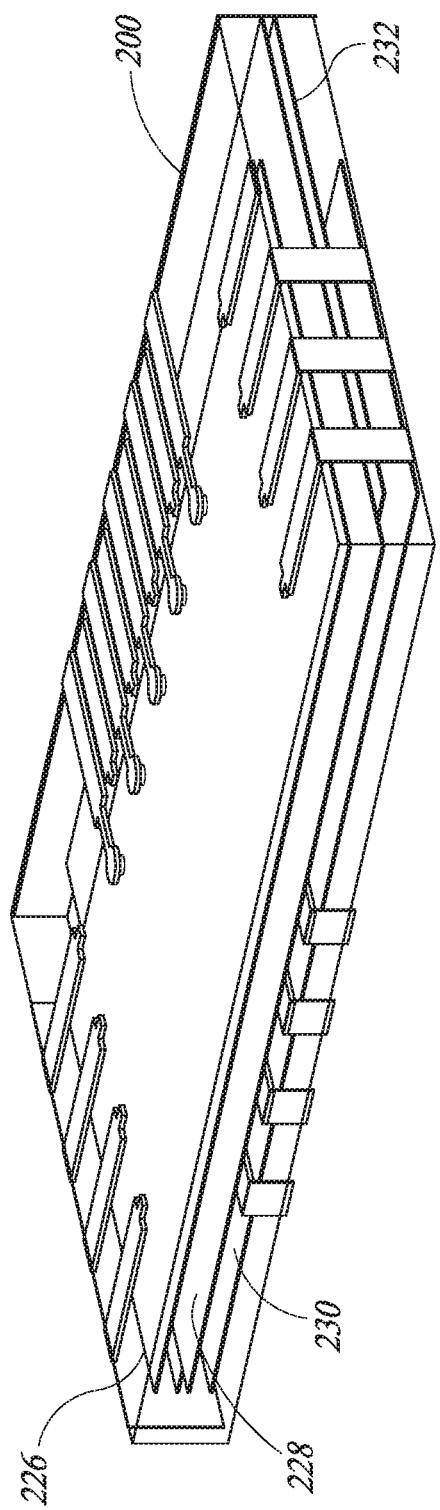

FIGS. 2A, 2B, and 2C illustrate perspective views of a PCB 200 having a 3D PCB interface, according to another embodiment. The PCB 200 may be used as an electrical connector for a cable interface between, for example, a motherboard and one or more peripheral devices, according to one embodiment. The PCB 200 provides multi-dimensional connections that may be used in connectors for various communications standards including, but not limited to, SCSI (Small Computer System Interface), SAS (Serial Attached SCSI), PCIe (Peripheral Component Interconnect Express), NVMe (Non-Volatile Memory Express), SATA (Serial ATA (Advanced Technology Attachment)), USB, and Firewire, according to various embodiments.

The PCB 200 includes a first surface 202 that is transversely opposites to a second surface 204, according to one embodiment. The second surface 204 is separated from the first surface 202 by thickness 206 that forms an edge between the first surface 202 and the second surface 204 about the periphery of the PCB 200, according to one embodiment. The PCB 200 may include a first edge 208, a second edge 210, the third edge 212, according to one embodiment. The first edge 208 may include a first conductive plane 214 that may be coupled to a number of landing pads 216, according to one embodiment. The first conductive plane 214 may be a side power plane, and the number of landing pads 216 may be top power landing pads, according to one embodiment. The second edge 210 may include a second conductive plane 218 electrically coupled to a number of landing pads 220, according to one embodiment. The second conductive plane 218 may be a side ground plane and the number of landing pads 220 may be top ground landing pads, according to one embodiment. The number of landing pads 220 may be disposed between a number of landing pads 221 that are configured to provide, for example, a high-speed input output ("HSIO") interface, according to one embodiment. Interlacing the grounded landing pads 220 between the number of landing pads 221, may reduce crosstalk between the signals carried by the number of landing pads 221, according to one embodiment. The third edge 212 may include a third plane 222 that is electrically coupled to a number of landing pads 224, according to one embodiment. The third plane 222 and the number of landing pads 224 may be used to couple a sensitivity net between the PCB 200 and a motherboard, according to one embodiment.

FIG. 2C depicts a partially transparent illustration of the PCB 200, to show a number of internal conductive planes that may be disposed within the PCB 200, according to one embodiment. The number of internal conductive planes may be coupled to landing pads (e.g., the landing pads 216, 220, 221, 224) and the side conductive planes (e.g., conductive planes 214, 218, 222) from the periphery of the PCB 200, according to one embodiment. The PCB 200 includes a first internal conductive plane 226, a second internal conductive plane 228, a third internal conductive plane 230, and a fourth internal conductive plane 232, according to one embodiment. Each of the first, second, third, and fourth internal conductive planes 226, 228, 230, and 232, may be implemented as a power plane, a ground plane, a reference plane, a sensitive net plane, and the like, according to various embodiments. More or fewer planes may be disposed internal to the PCB 200, according to various embodiments.

Figure 3A:
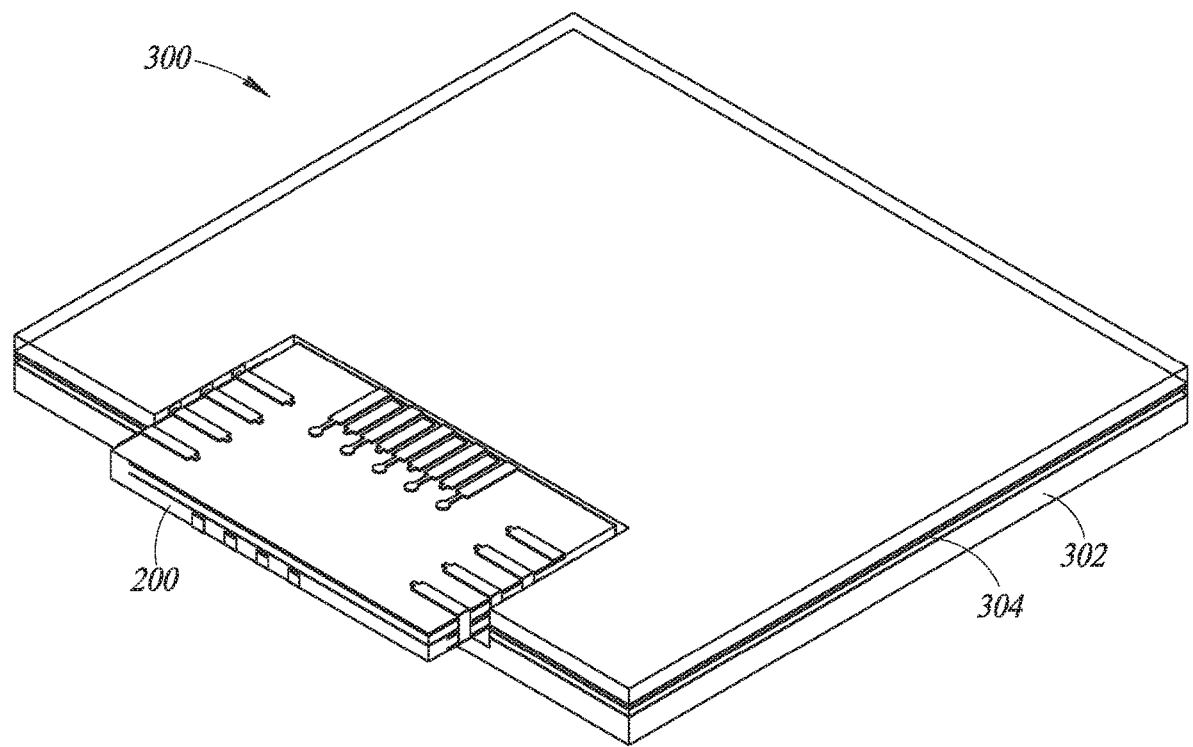
FIGS. 3A and 3B are diagrams of views depicting an illustrative system that includes edge to edge connections with a 3D PCB interface, according to one embodiment.
Figure 3B:
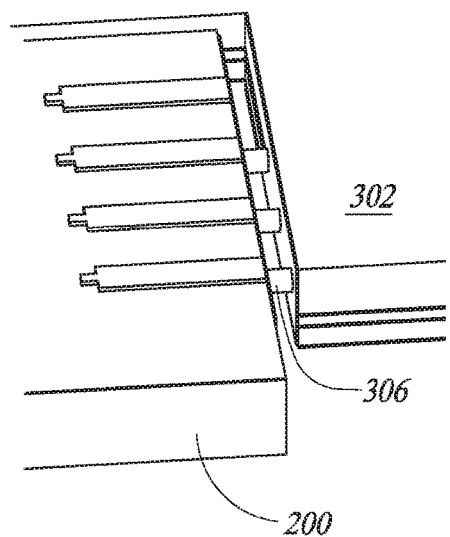

FIGS. 3A and 3B depict an illustration of a system 300 that includes a number of edge to edge connections between the PCB 200 and a PCB 302, according to one embodiment. The various peripheral conductive planes and landing pads of the PCB 200 may interface with one or more conductive planes 304 that are disposed within the PCB 302, according to various embodiments. The conductive planes of the PCB 200 may be coupled to the one or more conductive planes 304 through a plurality of conductive pins 306, according to one embodiment.

Figure 4A:
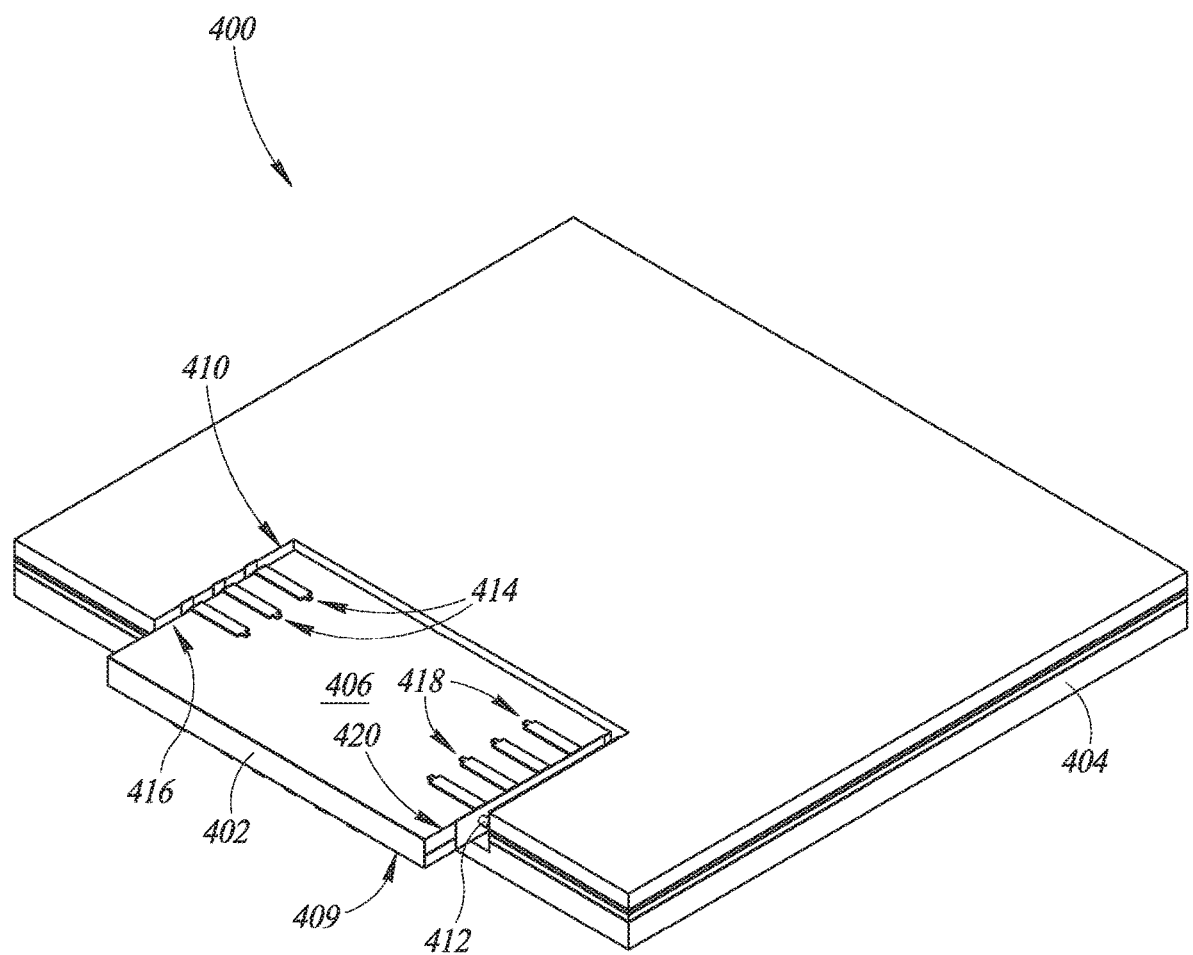
FIGS. 4A, 4B, and 4C are diagrams of views depicting an illustrative system that includes edge to edge connections with a 3D PCB interface, according to one embodiment.
Figure 4B:
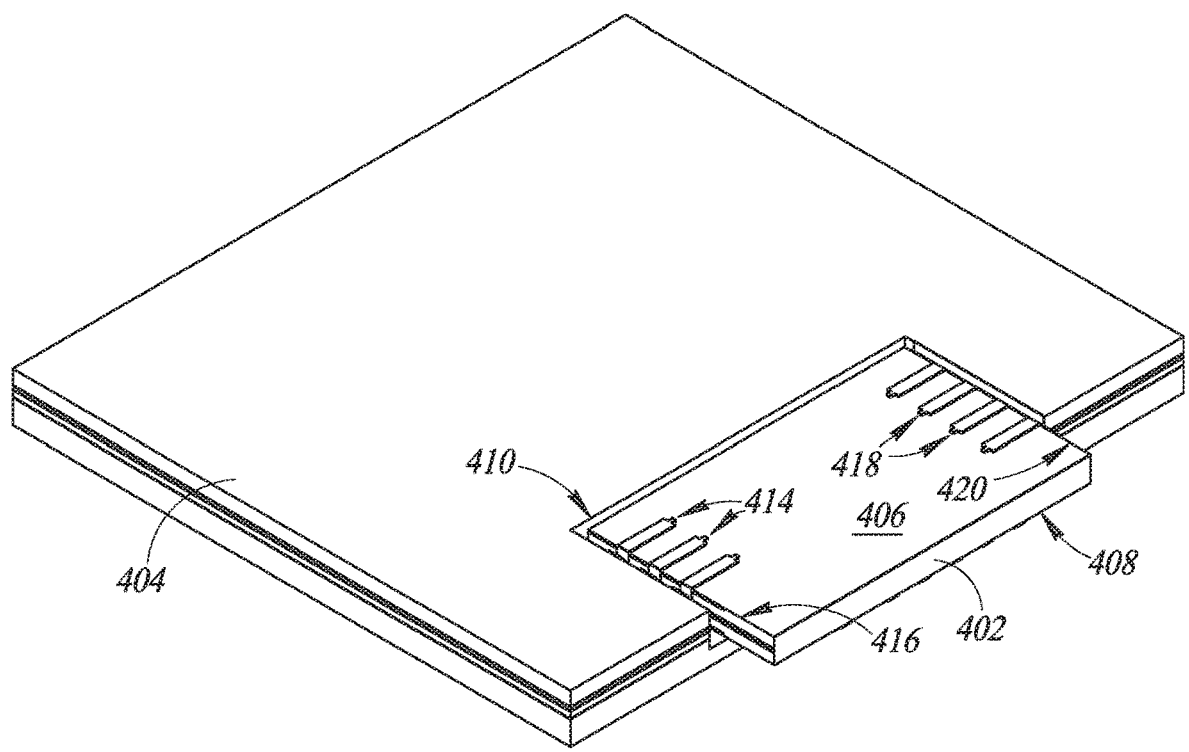
Figure 4C:
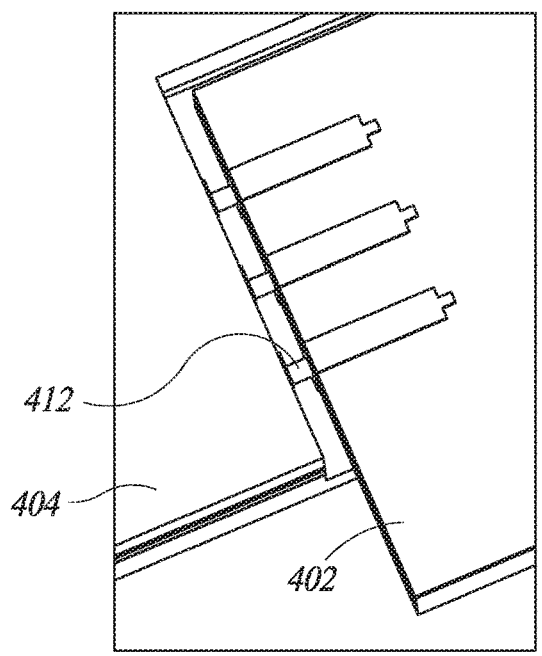

FIGS. 4A, 4B, and 4C depict and illustrations of a system 400 that includes a first PCB 402 electrically and physically coupled to a second PCB 404 using 3D edge to edge couplings, consistent with embodiments of the present disclosure. The first PCB 402 has a first surface 406 that is transversely opposed to a second surface 408 and that is separated by a thickness at forms an edge between the first surface 406 second surface 408 around the periphery of the first PCB 402, according to one embodiment. The system 400 illustrates that two edges of the first PCB 402 may be used to interface with the second PCB 404, according to one embodiment. The system 400 also illustrates that the first PCB 402 may engage with the second PCB 404 in a recess 410 that is formed in the second PCB 404, according to one embodiment. The first PCB 402 may be coupled to the second PCB 404 through a plurality of conductive pins 412, according to one embodiment. The first PCB 402 may include a number of landing pads 414 that are disposed along a first edge 416, and may include a number of landing pads 418 that are disposed along a second edge 420, according to one embodiment. The number of landing pads 414 may perform a first function (e.g., power, ground, HSIO), and the number of landing pads 418 may perform a second function (e.g., power, ground, HSIO) for the first PCB 402, according to one embodiment.

Figure 5:
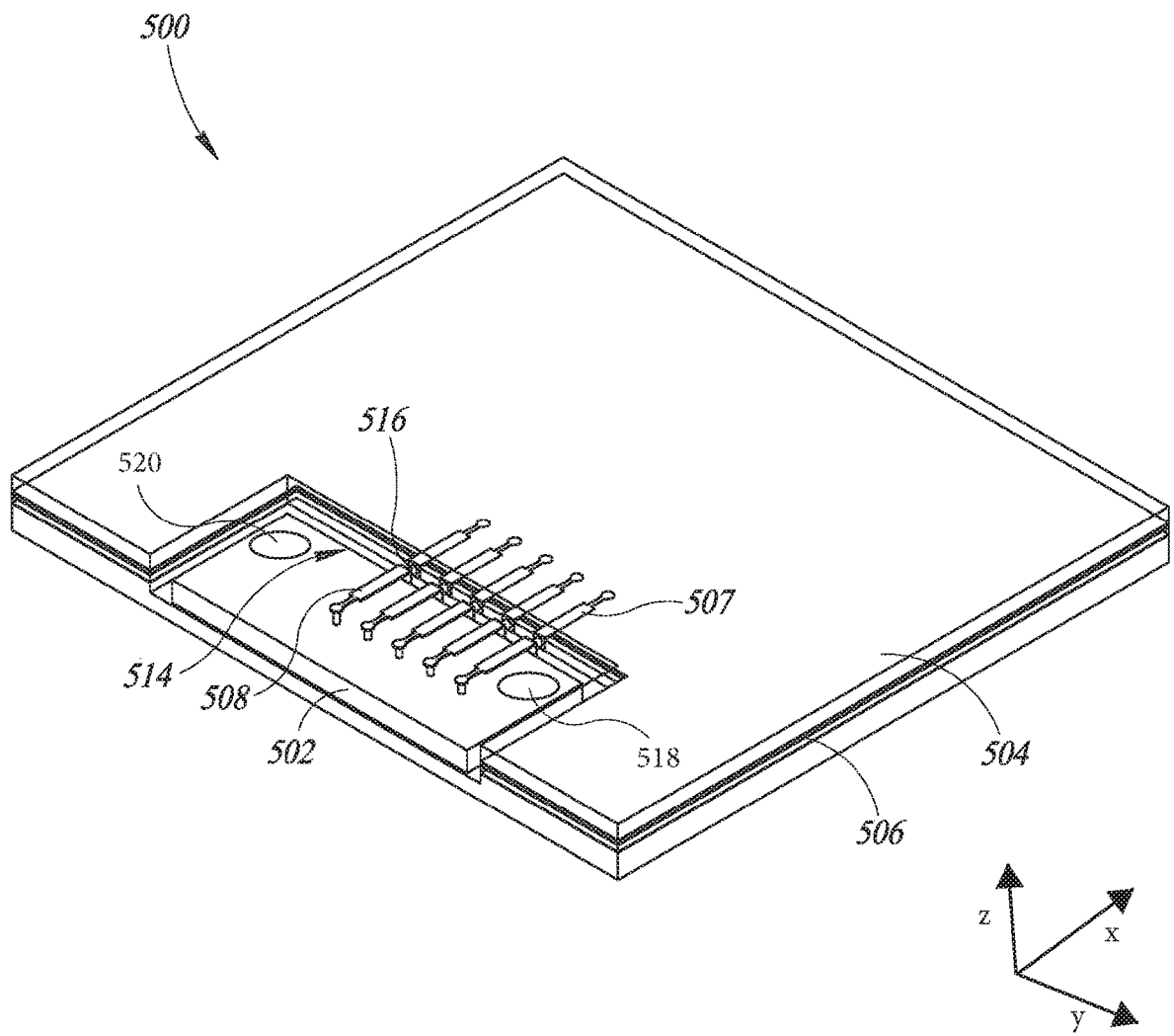
FIG. 5 is a diagram of a view depicting an illustrative system that includes edge to edge connections with a 3D PCB interface, according to one embodiment.

FIG. 5 depicts an illustration of a system 500 that includes a first PCB 502 electrically and physically coupled to a second PCB 504 using 3D edge to edge couplings, consistent with embodiments of the present disclosure. The second PCB 504 includes one or more conductive planes 506 and landing pads 507, which the first PCB 502 electrically couples to with landing pads 508, according to one embodiment. The second PCB 504 includes a recess into which the first PCB 502 may be inserted, according to one embodiment. The first PCB 502 includes a first edge 514 that electrically couples to a first edge 516 of the second PCB 504, through the landing pads 507 and the landing pads 508, according to one embodiment. The system 500 illustrates that one edge of the first PCB 502 may be used to interface with the second PCB 504, according to one embodiment.

The first PCB 502 may include one or more retention mechanisms to cause the first PCB 502 to maintain electrical connection with the second PCB 504. In one embodiment, the retention mechanisms enable the first PCB 502 to mate with the second PCB 504 by sliding in the direction of one axis (e.g., the x-axis) while limiting the first PCB 502 from moving in other axes. The first PCB 502 may include a first aperture 518 and a second aperture 520 that couples or mates with ball detents or other retention mechanisms that reduce the likelihood of the first PCB from inadvertently sliding away from the second PCB 504, according to one embodiment. Although not explicitly shown in the drawing for the other PCB to PCB interfaces, it is to be understood that this disclosed retention mechanism or any one of another of other types of mechanical connectors/connections or other mechanical retention mechanisms may be implemented with any of the herein disclosed embodiments of PCB to PCB interfaces, according to various embodiments.

Figure 6:
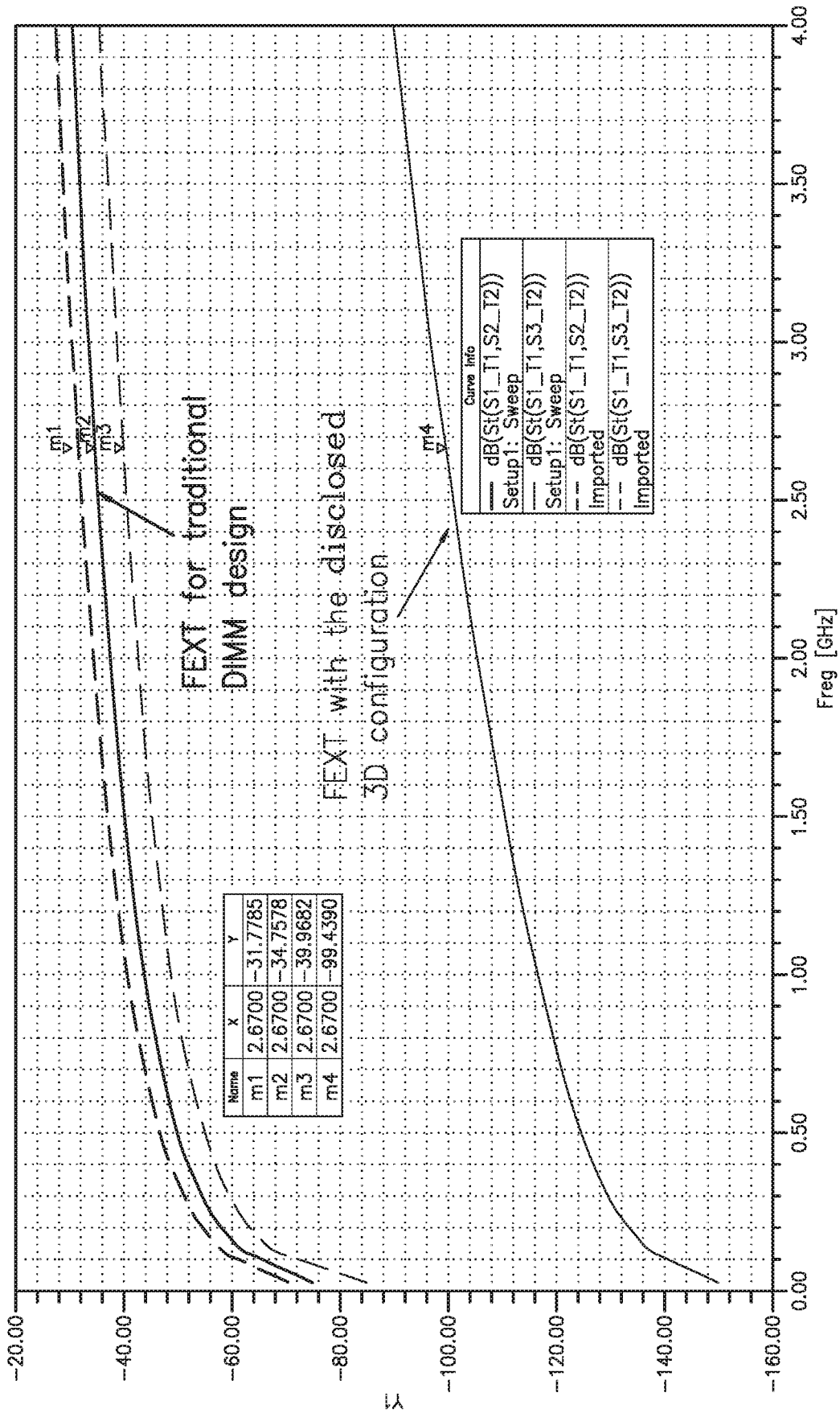
FIG. 6 is a diagram of a plot that illustrates potential crosstalk improvements from implementation of the disclosed 3D PCB interface, according to one embodiment.

FIG. 6 is an illustrative plot 600 of potential crosstalk improvements that may be achieved by adding the 3D PCB interface (e.g., the edge landing pads) of the present disclosure to a RAM DIMM, according to one embodiment. The plot 600 includes an x-axis for frequency and a y-axis for crosstalk (measured in decibels ("dB")). The difference in crosstalk (e.g., for cross-aisle signal aggressors) in a DIMM from a signal m3 (using conventional DIMM connectors) to a signal m4 (using the disclosed 3D PCB interface) is approximately 59 dB at approximately 2.67 Gigahertz ("GHz"), according to one implementation. FEXT (far end crosstalk) is crosstalk that is measured at a receiver end of signal propagation, with respect to an interfering transmitter.

Figure 7:
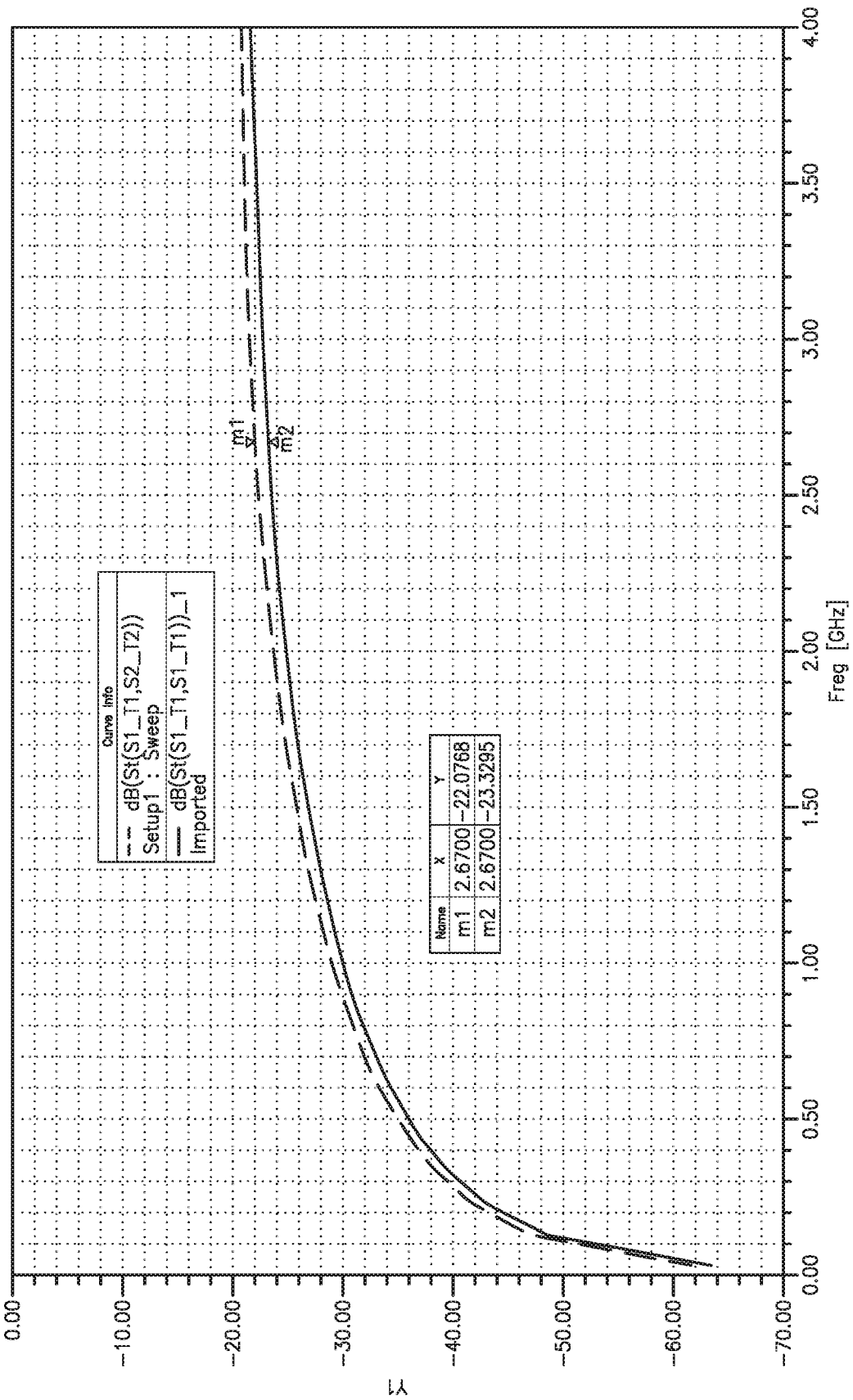
FIG. 7 is a diagram of a plot that illustrates potential signal reflection improvements from implementation of the disclosed 3D PCB interface, according to one embodiment.

FIG. 7 is an illustrative plot 700 illustrates reductions in signal reflection that may be achieved for a DIMM that implements techniques consistent with the present disclosure. The plot 700 includes an x-axis for frequency and a y-axis for reflection (measured in dB). The difference in reflections in a DIMM from a signal m1 (using conventional DIMM connectors) to a signal m2 (using the disclosed 3D PCB interface) is approximately 1.3 dB at approximately 2.67 Gigahertz ("GHz"), according to one implementation.

Figure 8:
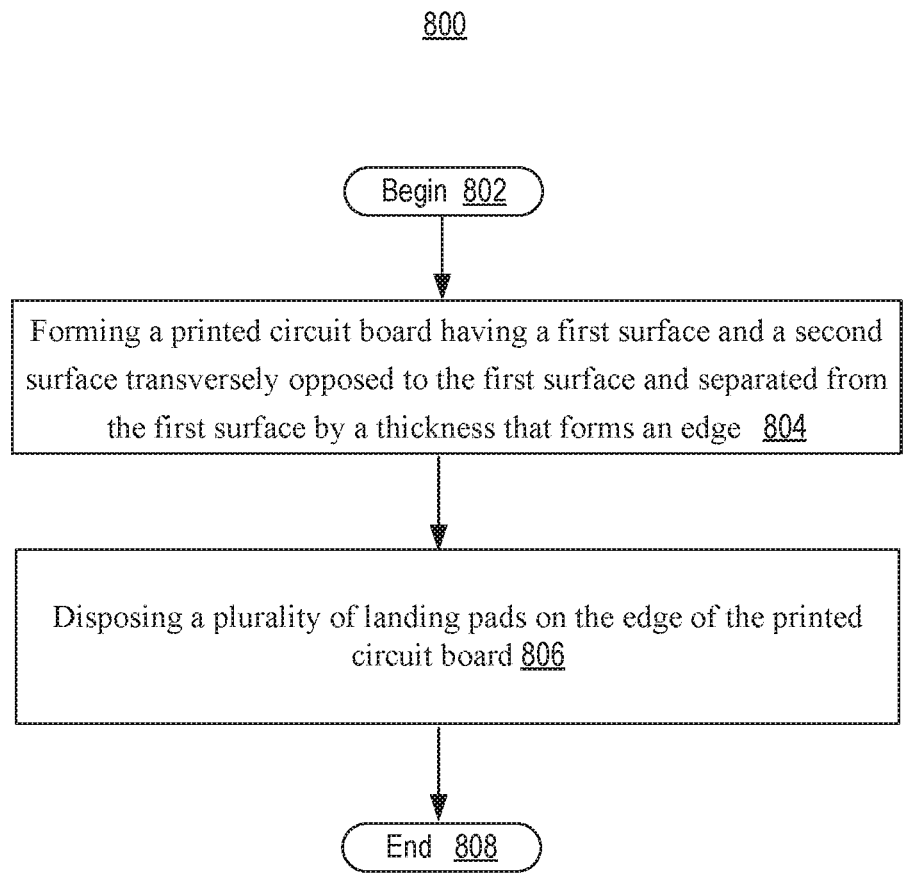
FIG. 8 is a high-level flow diagram of an illustrative method for manufacturing a printed circuit board with 3D interconnects to other printed circuit boards, according to one embodiment.

FIG. 8 is a high-level logic flow diagram of an illustrative method 800 for manufacturing a printed circuit board with 3D interconnects to other printed circuit boards, in accordance with at least one embodiment described herein. At operation 802, the method begins.

At operation 804, the method 800 includes forming a printed circuit board having a first surface and a second surface transversely opposed to the first surface and separated from the first surface by a thickness that forms an edge, according to one embodiment.

At operation 806, the method 800 includes disposing a plurality of landing pads on the edge of the printed circuit board, according to one embodiment.

At operation 808, the method 800 ends.

Figure 9:
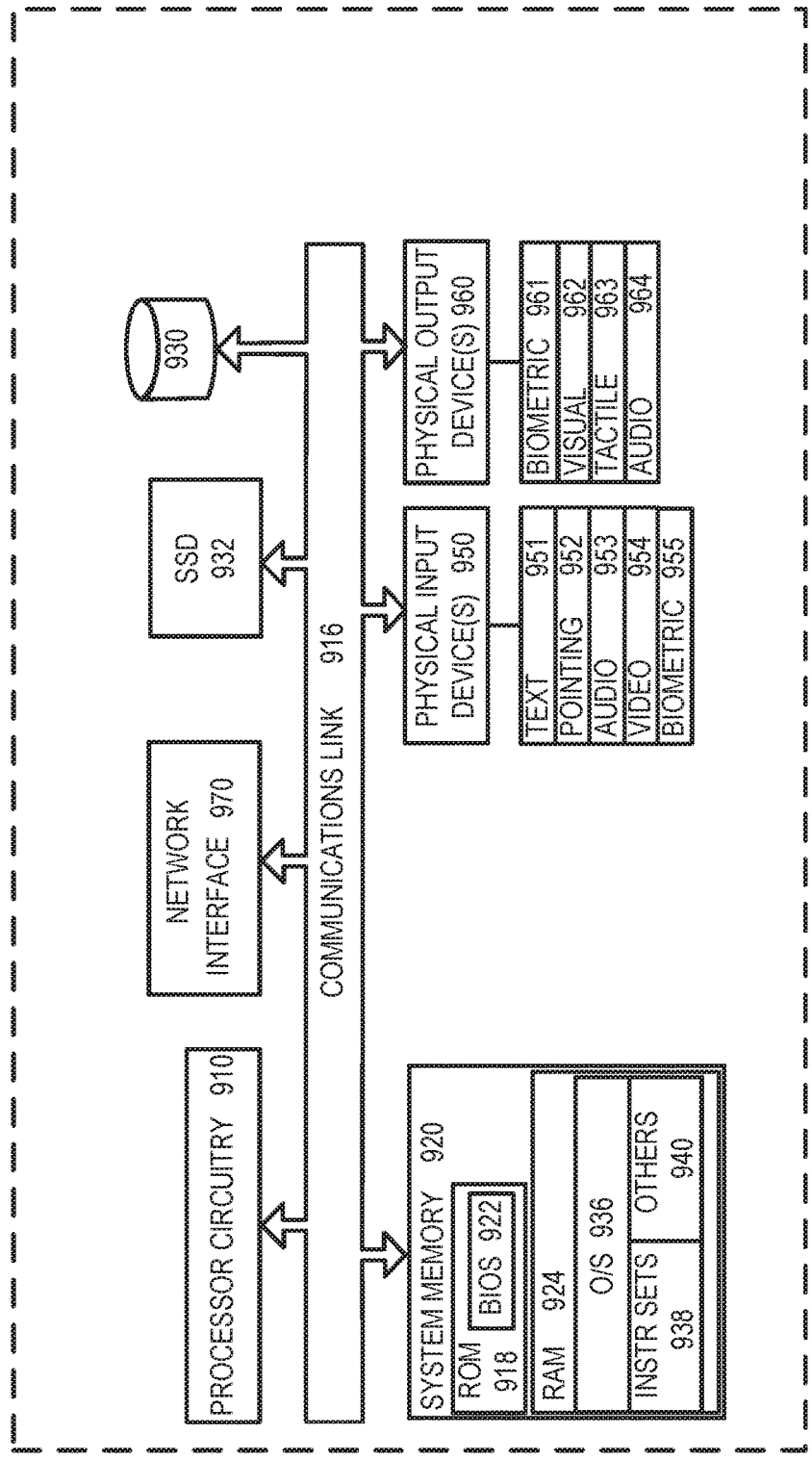
FIG. 9 is a block diagram of an illustrative processor-based device that includes at least one 3D PCB interface, according to one embodiment.

FIG. 9 is a block diagram of an illustrative processor-based device 900 equipped with a semiconductor package that includes at least one 3D PCB interface, such as is described above with regard to FIGS. 1A through 5, in accordance with at least one embodiment described herein. The following discussion provides a brief, general description of the components forming the illustrative processor-based device 900 such as a smartphone, wearable computing device, portable computing device, or similar device using a semiconductor package that includes at least one 3D PCB interface to facilitate communication between a first PCB (e.g., PCB 102) and a second PCB (e.g., PCB 104) and having the features depicted in any of FIGS. 1A through 5.

The processor-based device 900 includes processor circuitry 910 capable of executing machine-readable instruction sets, reading data from a storage device 930 and writing data to the storage device 930. Those skilled in the relevant art will appreciate that the illustrated embodiments as well as other embodiments can be practiced with other circuit-based device configurations, including portable electronic or handheld electronic devices, for instance smartphones, portable computers, wearable computers, microprocessor-based or programmable consumer electronics, personal computers ("PCs"), network PCs, minicomputers, mainframe computers, and the like.

The processor circuitry 910 may include any number of hardwired or configurable circuits, some or all of which may include programmable and/or configurable combinations of electronic components, semiconductor devices, and/or logic elements that are disposed partially or wholly in a PC, server, or other computing system capable of executing machine-readable instructions. The processor-based device 900 includes the processor circuitry 910 and bus or similar communications link 916 that communicably couples and facilitates the exchange of information and/or data between various system components including a system memory 920, one or more rotating data storage devices 930, and/or one or more solid state storage devices 932. The processor-based device 900 may be referred to in the singular herein, but this is not intended to limit the embodiments to a single device and/or system, since in certain embodiments, there will be more than one processor-based device 900 that incorporates, includes, or contains any number of communicably coupled, collocated, or remote networked circuits or devices.

The processor circuitry 910 may include any number, type, or combination of devices. At times, the processor circuitry 910 may be implemented in whole or in part in the form of semiconductor devices such as diodes, transistors, inductors, capacitors, and resistors. Such an implementation may include, but is not limited to any current or future developed single- or multi-core processor or microprocessor, such as: on or more systems on a chip (SOCs); central processing units (CPUs); digital signal processors (DSPs); graphics processing units (GPUs); application-specific integrated circuits (ASICs), programmable logic units, field programmable gate arrays (FPGAs), and the like. Unless described otherwise, the construction and operation of the various blocks shown in FIG. 9 are of conventional design. Consequently, such blocks need not be described in further detail herein, as they will be understood by those skilled in the relevant art. The communications link 916 that interconnects at least some of the components of the processor-based device 900 may employ any known serial or parallel bus structures or architectures. The communications link 916 may include hardware such as printed circuit boards that are configured with one or more implementations of the 3D PCB interface disclosed herein.

The system memory 920 may include read-only memory ("ROM") 918 and random-access memory ("RAM") 924. A portion of the ROM 918 may be used to store or otherwise retain a basic input/output system ("BIOS") 922. The BIOS 922 provides basic functionality to the processor-based device 900, for example by causing the processor circuitry 910 to load one or more machine-readable instruction sets. In embodiments, at least some of the one or more machine-readable instruction sets cause at least a portion of the processor circuitry 910 to provide, create, produce, transition, and/or function as a dedicated, specific, and particular machine, for example a word processing machine, a digital image acquisition machine, a media playing machine, a communications device, and similar. The RAM 924 may be a SIMM or DIMM memory module that includes one or more printed circuit boards that are configured with one or more implementations of the 3D PCB interface disclosed herein.

The processor-based device 900 may include one or more communicably coupled, non-transitory, data storage devices, such as one or more hard disk drives 930 and/or one or more solid-state storage devices 932. The one or more data storage devices 930 may include any current or future developed storage appliances, networks, and/or devices. Non-limiting examples of such data storage devices 930 may include, but are not limited to, any current or future developed non-transitory storage appliances or devices, such as one or more magnetic storage devices, one or more optical storage devices, one or more electro-resistive storage devices, one or more molecular storage devices, one or more quantum storage devices, or various combinations thereof. In some implementations, the one or more data storage devices 930 may include one or more removable storage devices, such as one or more non-volatile drives, non-volatile memories, non-volatile storage units, or similar appliances or devices capable of communicable coupling to and decoupling from the processor-based device 900.

The one or more data storage devices 930 and/or the one or more solid-state storage devices 932 may include interfaces or controllers (not shown) communicatively coupling the respective storage device or system to the communications link 916. The one or more data storage devices 930 may store, retain, or otherwise contain machine-readable instruction sets, data structures, program modules, data stores, databases, logical structures, and/or other data useful to the processor circuitry 910 and/or one or more applications executed on or by the processor circuitry 910. In some instances, one or more data storage devices 930 may be communicably coupled to the processor circuitry 910, for example via communications link 916 or via one or more wired communications interfaces (e.g., Universal Serial Bus or USB); one or more wireless communications interfaces (e.g., Bluetooth®, Near Field Communication or NFC); one or more wired network interfaces (e.g., IEEE 802.3 or Ethernet); and/or one or more wireless network interfaces (e.g., IEEE 802.11 or WiFi®). The one or more wired communications interfaces may include connectors or cables having one or more printed circuit boards that are configured with one or more implementations of the 3D PCB interface disclosed herein.

Machine-readable instruction sets 938 and other programs, applications, logic sets, and/or modules 940 may be stored in whole or in part in the system memory 920. Such instruction sets 938 may be transferred, in whole or in part, from the one or more data storage devices 930 and/or the solid-state storage device 932. The instruction sets 938 may be loaded, stored, or otherwise retained in system memory 920, in whole or in part, during execution by the processor circuitry 910. The machine-readable instruction sets 938 may include machine-readable and/or processor-readable code, instructions, or similar logic capable of providing the speech coaching functions and capabilities described herein.

A system user may provide, enter, or otherwise supply commands (e.g., selections, acknowledgements, confirmations, and similar) as well as information and/or data (e.g., subject identification information, color parameters) to the processor-based device 900 using one or more communicably coupled input devices 950. The one or more communicably coupled input devices 950 may be disposed local to or remote from the processor-based device 900. The input devices 950 may include one or more: text entry devices 951 (e.g., keyboard); pointing devices 952 (e.g., mouse, trackball, touchscreen); audio input devices 953; video input devices 954; and/or biometric input devices 955 (e.g., fingerprint scanner, facial recognition, iris print scanner, voice recognition circuitry). In embodiments, at least some of the one or more input devices 950 may include a wired or wireless interface that communicably couples the input device 950 to the processor-based device 900.

The system user may receive output from the processor-based device 900 via one or more output devices 960. In at least some implementations, the one or more output devices 960 may include, but are not limited to, one or more: biometric output devices 961; visual output or display devices 962; tactile output devices 963; audio output devices 964, or combinations thereof. In embodiments, at least some of the one or more output devices 960 may include a wired or a wireless communicable coupling to the processor-based device 902.

For convenience, a network interface 970, the processor circuitry 910, the system memory 920, the one or more input devices 950 and the one or more output devices 960 are illustrated as communicatively coupled to each other via the communications link 916, thereby providing connectivity between the above-described components. In alternative embodiments, the above-described components may be communicatively coupled in a different manner than illustrated in FIG. 9. For example, one or more of the above-described components may be directly coupled to other components, or may be coupled to each other, via one or more intermediary components (not shown). In some embodiments, all or a portion of the communications link 916 may be omitted and the components are coupled directly to each other using suitable wired or wireless connections.

Additionally, operations for the embodiments have been further described with reference to the above figures and accompanying examples. Some of the figures may include a logic flow. Although such figures presented herein may include a particular logic flow, it can be appreciated that the logic flow merely provides an example of how the general functionality described herein can be implemented. Further, the given logic flow does not necessarily have to be executed in the order presented unless otherwise indicated. The embodiments are not limited to this context.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. Thus, the breadth and scope of the present invention should not be limited by any of the above-described exemplary embodiments, but should be defined only in accordance with the following claims and their equivalents.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

Reference throughout this specification to "one embodiment", "an embodiment", or "an implementation" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in any embodiment herein, the term "logic" may refer to an application, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry," as used in any embodiment herein, may comprise, for example, singly or in any combination, hardwired circuitry, programmable circuitry, state machine circuitry, logic and/or firmware that stores instructions executed by programmable circuitry. The circuitry may be embodied as an integrated circuit, such as an integrated circuit chip. In some embodiments, the circuitry may be formed, at least in part, within a memory controller that executes code and/or instructions sets (e.g., software, firmware, etc.) corresponding to the functionality described herein, thus transforming a general-purpose processor into a specific-purpose processing environment to perform one or more of the operations described herein. In some embodiments, the various components and circuitry of the memory controller circuitry or other systems may be combined in a system-on-a-chip (SoC) architecture.

Embodiments of the operations described herein may be implemented in a computer-readable storage device having stored thereon instructions that when executed by one or more processors perform the methods. The processor may include, for example, a processing unit and/or programmable circuitry. The storage device may include a machine readable storage device including any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), non-volatile memories, magnetic or optical cards, or any type of storage devices suitable for storing electronic instructions.

In some embodiments, a hardware description language (HDL) may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

In some embodiments, a Verilog hardware description language (HDL) may be used to specify circuit and/or logic implementation(s) for the various logic and/or circuitry described herein. For example, in one embodiment, the HDL may comply or be compatible with IEEE standard 62530-2011: SystemVerilog—Unified Hardware Design, Specification, and Verification Language, dated Jul. 7, 2011; IEEE Std 1800™-2012: IEEE Standard for SystemVerilog—Unified Hardware Design, Specification, and Verification Language, released Feb. 21, 2013; IEEE standard 1364-2005: IEEE Standard for Verilog Hardware Description Language, dated Apr. 18, 2006 and/or other versions of Verilog HDL and/or SystemVerilog standards.

EXAMPLES

Examples of the present disclosure include subject material such as a memory controller, a method, and a system related to improving memory array read rates, as discussed below.

Example 1

According to this example, there is provided a printed circuit board. The printed circuit board may include a first surface; a second surface transversely opposed to the first surface, the second surface being separated from the first surface a thickness that forms an edge; and a plurality of landing pads disposed on the edge and electrically coupled to one or more conductive traces or conductive planes of the printed circuit board.

Example 2

This example includes the elements of example 1, wherein the plurality of landing pads to electrically couple the one or more conductive traces or conductive planes to one or more external sources of electronics signals.

Example 3

This example includes the elements of example 1, wherein the plurality of landing pads is a plurality of first landing pads, wherein the edge is a first edge, wherein the second surface being separated from the first surface by the thickness that forms a second edge, wherein the printed circuit board further includes at least one second landing pad disposed on the second edge, wherein the at least one second landing pad being electrically coupled to the one or more conductive traces or conductive planes.

Example 4

This example includes the elements of example 1, wherein the plurality of landing pads to electrically couple the printed circuit board to a plurality of conductive pins of a second printed circuit board, to extend one or more signal paths from the printed circuit board to the second printed circuit board.

Example 5

This example includes the elements of example 1, wherein the plurality of landing pads is a plurality of first landing pads, wherein the printed circuit board further includes a plurality of second landing pads disposed on the first surface; and a plurality of third landing pads disposed on the second surface.

Example 6

This example includes the elements of example 1, wherein the plurality of second landing pads to electrically contact a plurality of first conductive pins carried by a second printed circuit board, wherein the plurality of third landing pads to electrically contact a plurality of second conductive pins carried by the second printed circuit board.

Example 7

This example includes the elements of example 1, wherein the first surface carries a plurality of first memory modules, wherein the second surface carries a plurality of second memory modules, wherein the one or more conductive traces or conductive planes at least partially electrically couple the plurality of first memory modules and the plurality of second memory modules to the plurality of landing pads.

Example 8

This example includes the elements of example 1, wherein the one or more conductive traces or conductive planes include one or more of a power plane, or a reference plane.

Example 9

This example includes the elements of example 1, wherein the printed circuit board is a portion of a communications cable connector to couple a first computing device to a second computing device.

Example 10

According to this example, there is provided a printed circuit board system. The printed circuit board system may include a first printed circuit board. The first printed circuit board may include a first surface; a second surface transversely opposed to the first surface, the second surface being separated from the first surface by a first thickness that forms a first edge; and a plurality of first landing pads disposed on the first printed circuit board. The printed circuit board system may include a second printed circuit board attachable to the first printed circuit board. The second printed circuit board may include a third surface; a fourth surface transversely opposed to the third surface, the fourth surface being separated from the third surface by a second thickness that forms a second edge; and a plurality of second landing pads disposed on the second edge and coupled to one or more conductive traces or conductive planes of the printed circuit board.

Example 11

This example includes the elements of example 10, wherein the first printed circuit board is a motherboard and the second printed circuit board is a memory module printed circuit board.

Example 12

This example includes the elements of example 10, wherein the first printed circuit board is a motherboard and the second printed circuit board is a portion of a communications cable connector.

Example 13

This example includes the elements of example 10, further including a slot in the first surface, wherein the plurality of first landing pads being disposed in the slot of the first surface of the first printed circuit board, wherein the slot to receive the second edge of the second printed circuit board to electrically couple the plurality of first landing pads to the plurality of second landing pads.

Example 14

This example includes the elements of example 13, further including a plurality of conductive pins attached to the plurality of the first landing pads or to the plurality of the second landing pads to facilitate electrically coupling the plurality of first landing pads to the plurality of second landing pads.

Example 15

This example includes the elements of example 10, wherein the plurality of first landing pads being disposed on the first edge of the first printed circuit board to enable edge to edge electrical coupling with the plurality of second landing pads disposed on the second edge of the second printed circuit board.

Example 16

This example includes the elements of example 10, further including a recess in the first surface and second surface through the first thickness of the first printed circuit board, the recess to receive the second printed circuit board, the recess including at least 3 edges formed by the first thickness.

Example 17

This example includes the elements of example 16, wherein the first edge is one of the at least 3 edges of the recess of the first printed circuit board.

Example 18

According to this example, there is provided a printed circuit board. The printed circuit board may include a first surface; a second surface transversely opposed to the first surface, the second surface being separated from the first surface by a first thickness that forms a first edge; and a plurality of first landing pads disposed on the printed circuit board to electrically couple to a plurality of second landing pads disposed on a second edge of a second printed circuit board attachable to the printed circuit board.

Example 19

This example includes the elements of example 18, wherein the printed circuit board is a motherboard and the second printed circuit board is a memory module printed circuit board.

Example 20

This example includes the elements of example 18, wherein the printed circuit board is a motherboard and the second printed circuit board is a portion of a communications cable connector.

Example 21

This example includes the elements of example 18, further including a slot in the first surface, wherein the plurality of first landing pads being disposed in the slot of the first surface of the printed circuit board, wherein the slot to receive the second edge of the second printed circuit board to electrically couple the plurality of first landing pads to the plurality of second landing pads.

Example 22

This example includes the elements of example 18, wherein the plurality of first landing pads being disposed on the first edge of the printed circuit board to enable edge to edge electrical coupling with the plurality of second landing pads disposed on the second edge of the second printed circuit board.

Example 23

According to this example, there is provided a method. The method may include forming a printed circuit board having a first surface and a second surface transversely opposed to the first surface and separated from the first surface by a thickness that forms an edge; and disposing a plurality of landing pads on the edge of the printed circuit board.

Example 24

This example includes the elements of example 23, wherein the plurality of landing pads being electrically coupled to one or more conductive traces or conductive planes of the printed circuit board, the one or more conductive traces or conductive planes to electrically couple the plurality of landing pads to one or more electronic components carried by the printed circuit board.

Example 25

This example includes the elements of example 24, wherein the one or more electronic components include memory dice.

Example 26

This example includes the elements of example 23, wherein the plurality of landing pads is a plurality of first landing pads, wherein the printed circuit board is a first printed circuit board, the method may further include disposing a plurality of second landing pads on the first surface and on the second surface to electrically couple to conductive pins carried by a second printed circuit board, wherein the second printed circuit board is a motherboard for one of a desktop computer, a laptop computer, a mobile device, a smart phone, or a networking device.

Example 27

According to this example, there is provided a printed circuit board. The printed circuit board may include a first surface; a second surface transversely opposed to the first surface, the second surface being separated from the first surface a thickness that forms an edge; and means for providing an electrical interconnect on an edge of the printed circuit board.

Example 28

This example includes the elements of example 27, wherein the means for providing an electrical interconnect on an edge of the printed circuit board includes to electrically couple one or more conductive traces or conductive planes of the printed circuit board to one or more external sources of electronics signals.

Example 29

This example includes the elements of example 27, wherein the means for providing an electrical interconnect on an edge of the printed circuit board includes a plurality of first landing pads, wherein the edge is a first edge, wherein the second surface being separated from the first surface by the thickness that forms a second edge, wherein the means for providing an electrical interconnect on an edge of the printed circuit board may further include at least one second landing pad disposed on the second edge, wherein the at least one second landing pad being electrically coupled to one or more conductive traces or conductive planes of the printed circuit board.

Example 30

This example includes the elements of example 27, wherein the means for providing an electrical interconnect on an edge of the printed circuit board to electrically couple the printed circuit board to a plurality of conductive pins of a second printed circuit board, to extend one or more signal paths from the printed circuit board to the second printed circuit board.

Example 31

This example includes the elements of example 27, wherein the means for providing an electrical interconnect on an edge of the printed circuit board includes a plurality of first landing pads, wherein the printed circuit board may include a plurality of second landing pads disposed on the first surface; and a plurality of third landing pads disposed on the second surface.

Example 32

This example includes the elements of example 31, wherein the plurality of second landing pads to electrically contact a plurality of first conductive pins carried by a second printed circuit board, wherein the plurality of third landing pads to electrically contact a plurality of second conductive pins carried by the second printed circuit board.

Example 33

This example includes the elements of example 27, wherein the first surface carries a plurality of first memory modules, wherein the second surface carries a plurality of second memory modules, wherein the printed circuit board includes one or more conductive traces or conductive planes to at least partially electrically couple the plurality of first memory modules and the plurality of second memory modules to the means for providing an electrical interconnect on an edge of the printed circuit board.

Example 34

This example includes the elements of example 27, further comprising: one or more conductive traces or conductive planes that are one or more of a power plane, or a reference plane.

Example 35

This example includes the elements of example 27, wherein the printed circuit board is a portion of a communications cable connector to couple a first computing device to a second computing device.

Example 36

According to this example, there is provided a device comprising means to perform the method of any one of examples 23 to 26.

Example 37

According to this example, there is provided a computer readable storage device having stored thereon instructions that when executed by one or more processors result in operations including the method according to any one of examples 23 to 26.

Example 38

According to this example, there is provided a printed circuit board system according to any one of examples 10 through 17, further comprising processor circuitry and a network interface.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:

1. A printed circuit board, comprising:
a first surface;
a second surface transversely opposed to the first surface, the second surface being separated from the first surface by a thickness between the first surface and the second surface;
an edge surface that is perpendicular to the first surface and that is perpendicular to the second surface, wherein the edge surface includes a first physical dimension that matches a first physical dimension of the thickness between the first surface and the second surface, wherein a second physical dimension of the edge surface approximately matches a first physical dimension of the first surface;
a plurality of conductive landing pads disposed on the edge surface and electrically coupled to one or more conductive traces or conductive planes of the printed circuit board.

2. The printed circuit board of claim 1, wherein the plurality of conductive landing pads to electrically couple the one or more conductive traces or conductive planes to one or more external sources of electronics signals.

3. The printed circuit board of claim 1, wherein the plurality of conductive landing pads is a plurality of first landing pads, wherein the edge surface is a first edge surface, wherein the second surface being separated from the first surface by the thickness that forms a second edge surface, wherein the printed circuit board further includes:
at least one second landing pad disposed on the second edge surface, wherein the at least one second landing pad being electrically coupled to the one or more conductive traces or conductive planes.

4. The printed circuit board of claim 1, wherein the plurality of conductive landing pads to electrically couple the printed circuit board to a plurality of conductive pins of a second printed circuit board, to extend one or more signal paths from the printed circuit board to the second printed circuit board.

5. The printed circuit board of claim 1, wherein the plurality of conductive landing pads is a plurality of first landing pads, wherein the printed circuit board further includes:
a plurality of second landing pads disposed on the first surface; and
a plurality of third landing pads disposed on the second surface.

6. The printed circuit board of claim 5, wherein the plurality of second landing pads to electrically contact a plurality of first conductive pins carried by a second printed circuit board, wherein the plurality of third landing pads to electrically contact a plurality of second conductive pins carried by the second printed circuit board.

7. The printed circuit board of claim 1, wherein the first surface carries a plurality of first memory modules, wherein the second surface carries a plurality of second memory modules, wherein the one or more conductive traces or conductive planes at least partially electrically couple the plurality of first memory modules and the plurality of second memory modules to the plurality of conductive landing pads.

8. The printed circuit board of claim 1, wherein the one or more conductive traces or conductive planes include one or more of a power plane, or a reference plane.

9. The printed circuit board of claim 1, wherein the printed circuit board is a portion of a communications cable connector to couple a first computing device to a second computing device.

10. A printed circuit board system, comprising:
a first printed circuit board, including:
a first surface;
a second surface transversely opposed to the first surface, the second surface being separated from the first surface by a first thickness between the first surface and the second surface;
an edge surface that is perpendicular to the first surface and that is perpendicular to the second surface, wherein the edge surface includes a first physical dimension that matches a first physical dimension of the first thickness between the first surface and the second surface, wherein a second physical dimension of the edge surface approximately matches a first physical dimension of the first surface; and
a plurality of first landing pads disposed on the edge surface of the first printed circuit board; and
a second printed circuit board attachable to the first printed circuit board, including:
a third surface;
a fourth surface transversely opposed to the third surface, the fourth surface being separated from the third surface by a second thickness that includes a second edge surface; and
a plurality of second landing pads disposed on the second edge surface and coupled to one or more conductive traces or conductive planes of the printed circuit board system.

11. The printed circuit board system of claim 10, wherein the first printed circuit board is a motherboard and the second printed circuit board is a memory module printed circuit board.

12. The printed circuit board system of claim 10, wherein the first printed circuit board is a motherboard and the second printed circuit board is a portion of a communications cable connector.

13. The printed circuit board system of claim 10, further comprising:
a slot in the first surface, wherein the plurality of first landing pads being disposed in the slot of the first surface of the first printed circuit board, wherein the slot to receive the second edge of the second printed circuit board to electrically couple the plurality of first landing pads to the plurality of second landing pads.

14. The printed circuit board system of claim 13, further comprising:
a plurality of conductive pins attached to the plurality of the first landing pads or to the plurality of the second landing pads to facilitate electrically coupling the plurality of first landing pads to the plurality of second landing pads.

15. The printed circuit board system of claim 10, wherein the plurality of first landing pads being disposed on the edge surface of the first printed circuit board to enable edge to edge electrical coupling with the plurality of second landing pads disposed on the second edge surface of the second printed circuit board.

16. The printed circuit board system of claim 10, further comprising:
a recess in the first surface and second surface through the first thickness of the first printed circuit board, the recess to receive the second printed circuit board, the recess including at least 3 edge surfaces formed by the first thickness.

17. The printed circuit board system of claim 16, wherein the edge surface of the first printed circuit board is one of the at least 3 edge surfaces of the recess of the first printed circuit board.

18. A printed circuit board, comprising:
a first surface;
a second surface transversely opposed to the first surface, the second surface being separated from the first surface by a first thickness between the first surface and the second surface;
a first edge surface that includes a first physical dimension that matches a first physical dimension of the first thickness between the first surface and the second surface, wherein a second physical dimension of the first edge surface approximately matches a first physical dimension of the first surface; and
a plurality of first landing pads disposed on the first edge surface of the printed circuit board to electrically couple to a plurality of second landing pads disposed on a second edge surface of a second printed circuit board attachable to the printed circuit board.

19. The printed circuit board of claim 18, wherein the printed circuit board is a motherboard and the second printed circuit board is a memory module printed circuit board.

20. The printed circuit board of claim 18, wherein the printed circuit board is a motherboard and the second printed circuit board is a portion of a communications cable connector.

21. The printed circuit board of claim 18, further comprising:
a slot in the first surface, wherein the plurality of first landing pads being disposed in the slot of the first surface of the printed circuit board, wherein the slot to receive the second edge surface of the second printed circuit board to electrically couple the plurality of first landing pads to the plurality of second landing pads.

22. The printed circuit board of claim 18, wherein the plurality of first landing pads being disposed on the first edge surface of the printed circuit board to enable edge to edge electrical coupling with the plurality of second landing pads disposed on the second edge surface of the second printed circuit board.

23. A method, comprising:
forming a printed circuit board having a first surface and a second surface transversely opposed to the first surface and separated from the first surface by a thickness that includes an edge surface, wherein the edge surface is perpendicular to the first surface and is perpendicular to the second surface, wherein the edge surface includes a first physical dimension that matches a first physical dimension of the thickness between the first surface and the second surface, wherein a second physical dimension of the edge surface approximately matches a first physical dimension of the first surface; and disposing a plurality of landing pads on the edge surface of the printed circuit board.

24. The method of claim 23, wherein the plurality of landing pads being electrically coupled to one or more conductive traces or conductive planes of the printed circuit board, the one or more conductive traces or conductive planes to electrically couple the plurality of landing pads to one or more electronic components carried by the printed circuit board.

25. The method of claim 24, wherein the one or more electronic components include memory dice.

26. The method of claim 23, wherein the plurality of landing pads is a plurality of first landing pads, wherein the printed circuit board is a first printed circuit board, the method further comprising:

disposing a plurality of second landing pads on the first surface and on the second surface to electrically couple to conductive pins carried by a second printed circuit board, wherein the second printed circuit board is a motherboard for one of a desktop computer, a laptop computer, a mobile device, a smart phone, or a networking device.

* * * * *